(12) United States Patent
Morise et al.

(10) Patent No.: US 7,269,059 B2
(45) Date of Patent: Sep. 11, 2007

(54) MAGNETIC RECORDING ELEMENT AND DEVICE

(75) Inventors: Hirofumi Morise, Kawasaki (JP); Shiho Nakamura, Fujisawa (JP); Shigeru Haneda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 124 days.

(21) Appl. No.: 11/147,256

(22) Filed: Jun. 8, 2005

(65) Prior Publication Data

US 2006/0060989 A1 Mar. 23, 2006

(30) Foreign Application Priority Data

Sep. 17, 2004 (JP) ............................. 2004-272376

(51) Int. Cl.
*G11C 7/00* (2006.01)

(52) U.S. Cl. ...................................... 365/158; 365/173
(58) Field of Classification Search ................ 365/158, 365/173
See application file for complete search history.

(56) References Cited

U.S. PATENT DOCUMENTS

| 5,695,864 A | 12/1997 | Slonczewski |
| 6,509,621 B2 * | 1/2003 | Nakao ......................... 257/421 |
| 2002/0012207 A1 * | 1/2002 | Singleton et al. ......... 360/324.1 |
| 2005/0168888 A1 * | 8/2005 | Miyauchi et al. ...... 360/324.12 |

FOREIGN PATENT DOCUMENTS

JP 2003-229544 8/2003

OTHER PUBLICATIONS

K. Yagami, et al., "Decreasing the switching Current in Spin-Momentum Transfer Switching by Decreasing $M_s$", J. Magn Soc., vol. 28, No. 2, Feb. 2004, pp. 149-152.

Yiming Huai, et al., "Observation of Spin-Transfer Switching in Deep Submicron-Sized and Low-Resistance Magnetic Tunnel Junctions", Applied Physics Letters, vol. 84, No. 16, Apr. 19, 2004, pp. 3118-3120.

Dexin Wang, et al., "70% TMR at Room Temperature for SDT Sandwich Junctions With CoFeB as Free and Reference Layers", IEEE Transactions on Magnetics, vol. 40, No. 4, Jul. 2004, pp. 2269-2271.

F.J. Albert, et al., "Spin-Polarized Current Switching of a Co Thin Film Nanomagnet", Applied Physics Letters, vol. 77, No. 23, Dec. 4, 2000, pp. 3809-3811.

(Continued)

*Primary Examiner*—Michael T Tran
(74) *Attorney, Agent, or Firm*—Oblon, Spivak, McClelland, Maier & Neustadt, P.C.

(57) ABSTRACT

A magnetic recording element, in which a spin-polarized electron is injected, has a layer whose magnetization direction is changed by the spin-polarized electron in accordance with a flow direction of the spin-polarized electron and records data in accordance with the magnetization direction. The magnetic recording element includes a free layer whose magnetization direction is changed by an action of a spin-polarized electron and has a spin polarization Pf. A pinned layer whose magnetization direction is fixed has a spin polarization Pp larger than the spin polarization Pf. An intermediate layer is interposed between the pinned layer and the free layer and consisting essentially of a nonmagnetic material.

16 Claims, 11 Drawing Sheets

OTHER PUBLICATIONS

R. Meservey, et al., "Spin-Polarized Electron Tunneling", Physics Reports, vol. 238, No. 4, 1994, pp. 173-243.

R.J. Soulen Jr., et al., "Measuring the Spin Polarization of a Metal with a Superconducting Point Contact", Science, vol. 282, Oct. 2, 1998, pp. 85-88.

U.S. Appl. No. 11/117,482, filed Apr. 29, 2005, Nakamura et al.

U.S. Appl. No. 11/147,256, filed Jun. 8, 2005, Morise et al.

* cited by examiner

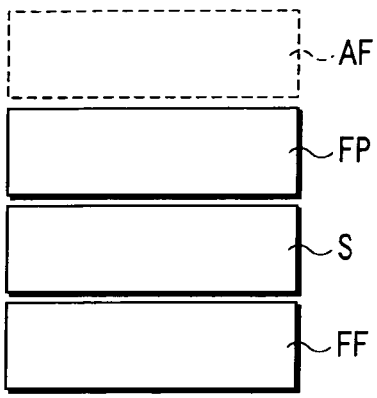
FIG. 1
| Material | Spin polarizability |
|---|---|
| Ni | 0.23 |
| Co | 0.35 |
| NiMnSb | 0.58 |
| $La_{0.7}Sr_{0.3}MnO_3$ | 0.78 |
FIG. 2
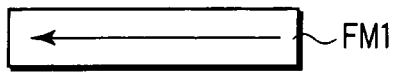
FIG. 3
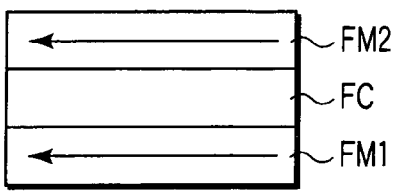
FIG. 4
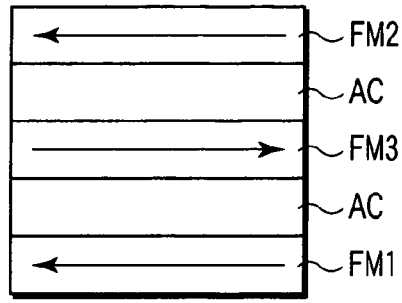
FIG. 6
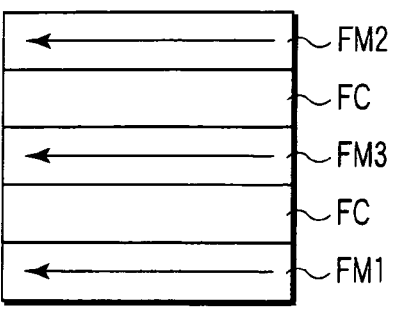
FIG. 5
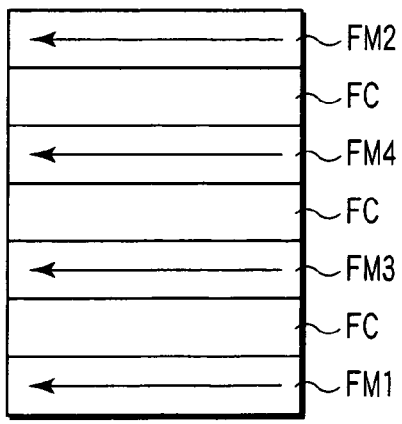
FIG. 7

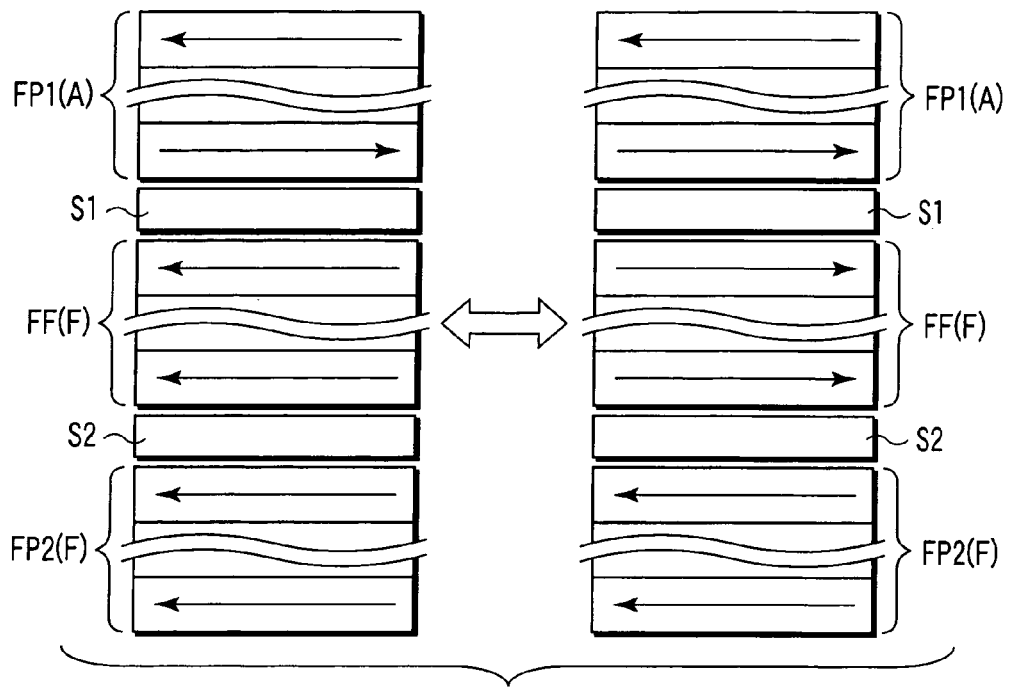
F I G. 30
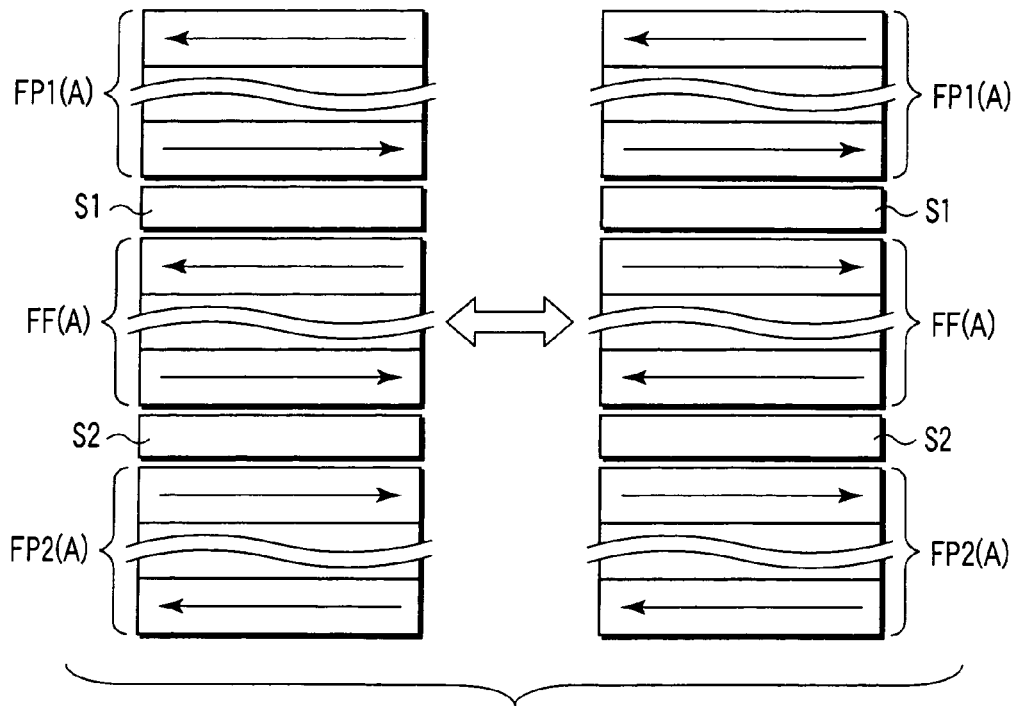
F I G. 31

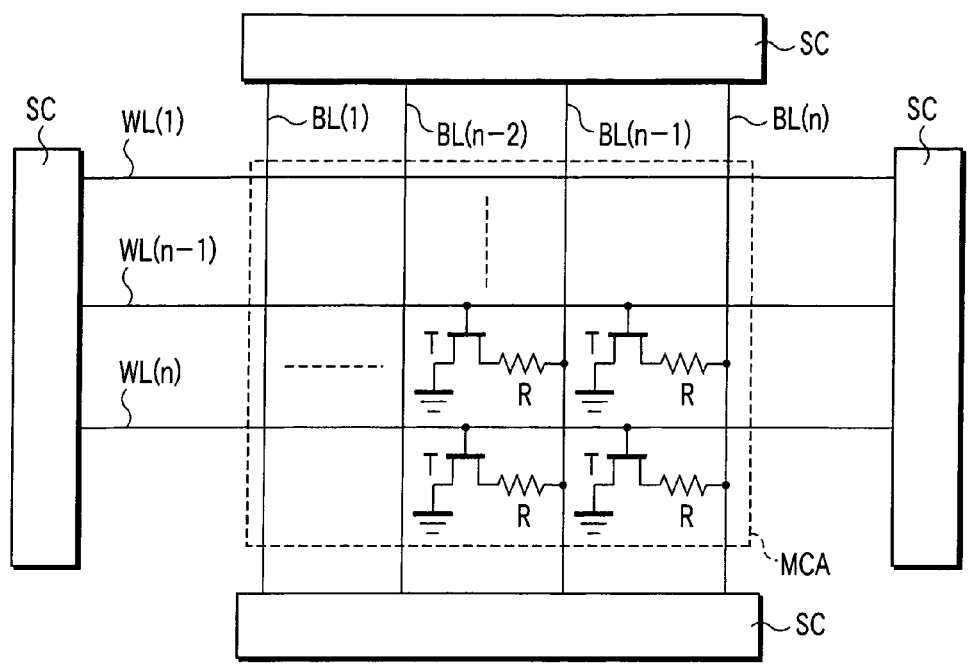
F I G. 34
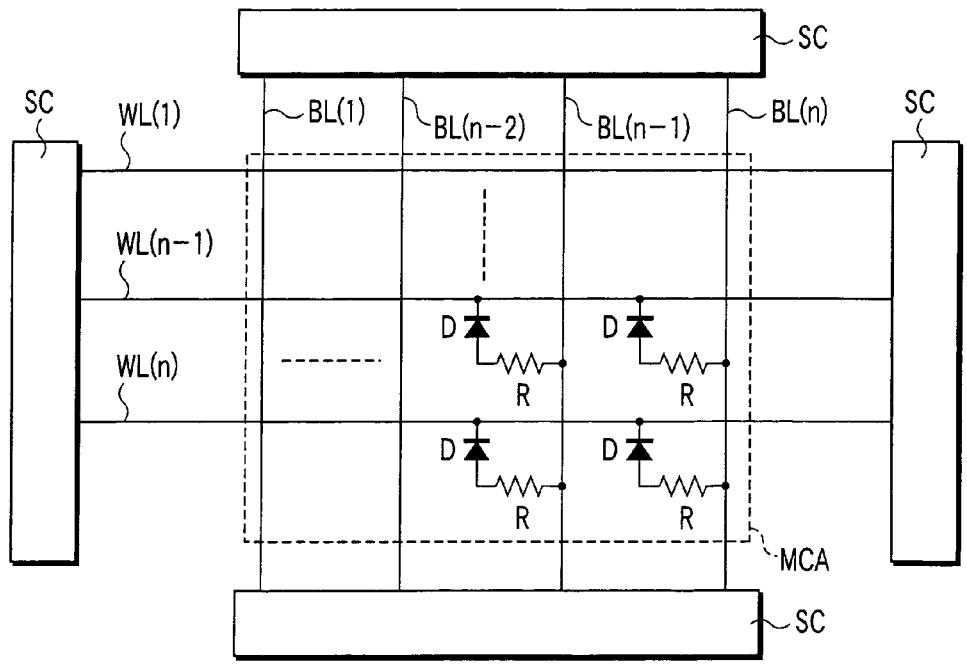
F I G. 35

MAGNETIC RECORDING ELEMENT AND DEVICE

CROSS-REFERENCE TO RELATED APPLICATIONS

This application is based upon and claims the benefit of priority from prior Japanese Patent Application No. 2004-272376, filed Sep. 17, 2004, the entire contents of which are incorporated herein by reference.

BACKGROUND OF THE INVENTION

1. Field of the Invention

The present invention relates to a magnetic recording element, and a magnetic recording device using that. For example, the present invention relates to a magnetic recording element, in which spin-polarized electrons flow to control the spin direction of a magnetic material, and which records data.

2. Description of the Related Art

In recent years, information recording devices have been used to support or promote the wide-ranging highly information-oriented society, because such devices satisfy various requirements such as mass capacity, high speed, durability and low cost. Moreover, it is desired to provide a technique of enhancing the foregoing features. Magnetic recording devices using the magnetic moment of a ferromagnetic material have been widely used as hard disk drives, for example. Recently, a magnetic recording device has been proposed to be used as a magnetoresistive random access memory (MRAM) having both high speed and non-volatility.

However, according to the requirements of recent high density, scale-down from 100 nanometers to several tens of nanometers or less is required in a unit cell storing one-bit data. For this reason, a technical barrier is appearing in the method of writing data. More specifically, according to electromagnetic field writing used for the foregoing hard disk drive and MRAM, the amount of current for generating a magnetic field required for write increases with a reduction of the memory cell size. In addition, a problem such as crosstalk to neighboring cells inevitably arises.

Recently, the direct current-driven magnetization switching is verified by the document, F. J. Albert et al., Appl. Phys. Lett. Vol. 77, pp. 3809-3811 Dec. 4, 2000. It is expected that the phenomenon will provide new writing capable of solving the problem in the foregoing current magnetic field writing.

The foregoing phenomenon is as follows. That is, when a conduction electron spin-polarized in a direction different from the magnetization direction (spin direction) of a magnetic material passes through the magnetic material, spin angular momentum of the conduction electron acts on and is transferred to the magnetization of the magnetic material to generate a torque to switch the magnetization direction of the magnetic material. Use of the phenomenon can achieve a more direct influence on the nanoscale magnetic material than the magnetization switching by electro-magnetic field and decrease current required for write with a reduction of the cell size.

However, there is the following problem so far. In order to switch the magnetization direction directly by a current, an extremely large current such as 10 mA to several mA is required when the cell size is about 100 nm to several tens of nanometers. Namely, efficiency of the direct current-driven magnetization switching must be enhanced in order to prevent device breakdown and exothermic reaction, and further to achieve low power consumption. In other words, there is a need to switch the magnetization direction by as small a current as possible.

BRIEF SUMMARY OF THE INVENTION

According to a first aspect of the present invention, there is provided a magnetic recording element in which a spin-polarized electron is injected comprising: a free layer whose magnetization direction is changed by an action of a spin-polarized electron and having a spin polarization Pf; a pinned layer whose magnetization direction is fixed and having a spin polarization Pp larger than the spin polarization Pf; and an intermediate layer interposed between the pinned layer and the free layer and consisting essentially of a nonmagnetic material.

According to a second aspect of the present invention, there is provided a magnetic recording element in which a spin-polarized electron is injected comprising: a free layer consisting of one or more film, and whose magnetization direction is changed by an action of a spin-polarized electron, and having a spin polarization Pf and a first surface and a second surface facing each other; a first intermediate layer provided on the first surface and consisting essentially of a nonmagnetic material; a first pinned layer provided on a surface of the first intermediate layer at an opposite side to the first surface and having a spin polarization Pp1, a magnetization direction of the first pinned layer being fixed and parallel to a magnetization direction of a film of the free layer contacting with the first intermediate layer; a second intermediate layer provided on the second surface and consisting essentially of a nonmagnetic material; and a second pinned layer provided on a surface of the second intermediate layer at an opposite side to the second surface and having a spin polarization Pp2, a magnetization direction of the second pinned layer being fixed and antiparallel to a magnetization direction of a film of the free layer contacting with the second intermediate layer, Pp1=Pp2>Pf or when Pp1≠Pp2, Pf≦Ppmin, which is smaller spin polarization of Pp1 and Pp2, being satisfied.

BRIEF DESCRIPTION OF THE SEVERAL VIEWS OF THE DRAWING

FIG. 1 schematically shows the cross-sectional structure of a magnetic recording element according to a first embodiment of the present invention;

FIG. 2 shows each spin polarization of typical materials;

FIGS. 3, 4, 5, 6, 7, 8, 9, 10, 11, 12, 13, 14, 15, 16 and 17 each schematically show the cross-sectional structure applicable to pin and free layers;

FIGS. 28, 29, 30 and 31 each schematically shows the cross-sectional structure realized by a stacked free layer and stacked pinned layers of the magnetic recording element according to the second embodiment;

FIG. 34 shows one memory cell having a magnetic recording element and select transistor; and FIG. 35 shows one memory cell having a magnetic recording element and diode.

DETAILED DESCRIPTION OF THE INVENTION

Figure 8:
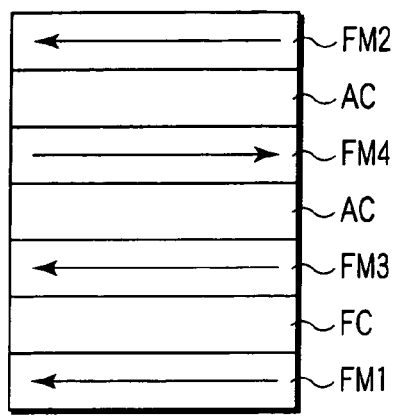

Embodiments of the present invention will be described below with reference to the accompanying drawings. In the following description, the same reference numerals are used to designate components having identical function and configuration, and an overlapping explanation is made if necessary.

(1) FIRST EMBODIMENT

The first embodiment relates to the structure of a magnetic recording element, that is, the structure having a single pinned layer.

[1-1] Structure

FIG. 1 schematically shows the cross-sectional structure of a magnetic recording element according to a first embodiment of the present invention. The magnetic recording element has the element structure given below as a basic structure. According to the element structure, ferromagnetic layer FP, intermediate layer (nonmagnetic layer) S and ferromagnetic layer FF are successively stacked. The ferromagnetic layer FP and/or ferromagnetic layer FF may have a stacked structure comprising several sub-layers as described later. In the following, explanation will be made giving the case where the foregoing ferromagnetic layers each comprise a signal layer as an example.

The magnetization direction of the ferromagnetic layer FP is fixed. For example, this is achieved by providing an antiferromagnetic layer AF on the ferromagnetic layer FP. Hereinafter, the ferromagnetic layer FP may be referred to as a pinned layer.

On the other hand, the pinning mechanism described above is not provided for the spin direction of the ferromagnetic layer FF. Thus, the spin direction of the ferromagnetic layer FF is variable. Hereinafter, the ferromagnetic layer FF may be referred to as a free layer.

The intermediate layer S requires a film thickness capable of isolating the ferromagnetic layers FP and FF to disregard direct interaction acting between these layers FP and FF. Simultaneously, the intermediate layer S needs to have a film thickness thinner than the spin diffusion length because the spin direction of an electron needs to stay unchanged until a conduction electron transmitting through the ferromagnetic layer FP reaches the ferromagnetic layer FF when current is carried into the element. A nonmagnetic metal, nonmagnetic semiconductor and insulating film may be used as the intermediate layer S.

Materials having different spin polarizations are used as the pin and free layers FP and FF. The pinned layer FP has a high spin polarization while the free layer FF has a low spin polarization. Moreover, the pinned layer FP has spin polarization higher than the free layer FF at least. The spin polarization P is defined by the following equation in terms of the density of states for the majority spin electrons $D\uparrow$ of a magnetic material and the density of states for the majority spin electrons $D\downarrow$ thereof.

$$P=(D\uparrow-D\downarrow)/(D\uparrow+D\downarrow)$$

The spin polarization is a material intrinsic quantity, and is determined depending on the materials used and their chemical composition. The spin polarizations of typical materials known in the following documents 1 and 2 are shown in FIG. 2.

Document 1: P. M. Tedrow and R. Meservey, Phys. Rep. 238, No. 4 (1994) pp. 173-243

Document 2: R. J. Soulen et al., Science Vol. 282, pp. 85-88, Oct. 2, 1998

The foregoing element is manufactured using sputtering and lithography techniques. The details will be described in the following examples.

[1-2] Write and Read

The write and read method by the magnetic recording element will be described below.

Electrons are made to flow from the pinned layer FP toward the free layer FF in order to switch the magnetization direction of the free layer FF antiparallel to that of the pinned layer FP to parallel to it. In general, most of the electrons that have passed through a magnetic material have spins parallel to the magnetization direction of the magnetic material. Therefore, most of the electrons having passed through the pinned layer FP have spins parallel to the magnetization direction of the pinned layer FP. The remaining electrons have spins antiparallel to the magnetization direction of the pinned layer FP.

A conduction electron having a spin parallel to the magnetization direction of the pinned layer FP flows into the free layer FF, and contributes to a torque acting on the magnetization of the free layer FF. On the other hand, an electron having a spin antiparallel to the magnetization direction of the pinned layer FP is reflected by the pinned layer FP. Otherwise, it flows into the free layer FF, and thereby, hinders the magnetization direction of the free layer FF from being switched. Of the electrons passing through a magnetic material, the amount of electrons having the spins parallel to the magnetization direction of the magnetic material depends on the spin polarization of the magnetic material. Thus, a material having high spin polarization is used as the pinned layer FP as described in this embodiment. By doing so, it is possible to reduce a ratio of the electrons flowing into the free layer FF and having spins antiparallel to the magnetization direction of the pinned layer FP to the electrons having opposite direction. As a result, even if the electronic current is small, the magnetization direction of the free layer FF is effectively switched from the antiparallel direction to the pinned layer FP to the parallel direction to it. In other words, switching current can be small.

Conversely, electrons are made to flow from the free layer FF toward the pinned layer FP in order to switch the magnetization direction of the free layer FF parallel to that of the pinned layer FP to antiparallel to it. After passing through the free layer FF, most of the electrons having spins antiparallel to the magnetization direction of the pinned layer FP are reflected by the pinned layer FP, and then, return to the free layer FF. The electrons again flow into the free layer FF, and electrons having a spin antiparallel to the magnetization direction of the pinned layer FP contribute to a torque acting on the magnetization of the free layer FF. After passing through the free layer FF, a part of the electrons having spins antiparallel to the magnetization direction of the pinned layer FP passes through the pinned layer FP although it is a little.

According to the present embodiment, the material having low spin polarization is used as the free layer FF while the material having high spin polarization is used as the pinned layer FP. Using a material having low spin polarization as the free layer FF can increase electrons having spins antiparallel to the magnetization direction of the pinned layer FP (free layer FF) in the electronic current flowing out from the free layer FF. Moreover, using material having high spin polarization as the pinned layer FP can enhance a ratio of electrons which is reflected by the pinned layer FP in electrons having a spin antiparallel to the magnetization direction of the pinned layer F. Thus, the effects described above are combined to reduce current required for switching the magnetization direction of the free layer FF from the parallel direction to the pinned layer FP to the antiparallel direction to it.

The current is carried to the direction crossing the junction surface of each layer, and thereby, it is possible to control the magnetization direction of the free layer FF. Binary logic data "0" or "1" is allocated in accordance with the magnetization direction of the free layer FF, and thereby, the element can record one-bit data.

The element can send out data stored as the magnetization direction of the free layer FF using magnetoresistance effect. More specifically, sense current having less intensity than switching current is carried between pin and free layers FP and FF. If the magnetization direction of the free layer FF is parallel to that of the pinned layer FP, the resistance is relatively small. On the other hand, if the magnetization direction of the free layer FF is antiparallel to that of the pinned layer FP, the resistance is relatively large.

Switching current Jp to switch the magnetization direction of the free layer FF parallel to the pinned layer FP to the antiparallel to it is larger than the switching current Jap to switch the magnetization direction of the free layer FF antiparallel to the pinned layer FP to the parallel to it in general. This results from the following reason. The latter switching results from torque which the electrons having passed through the pinned layer FP mainly contribute while the former switching results from a torque which the electrons reflected by the pinned layer after transmitting through the free layer contribute. Thus, asymmetry exists between the switching currents Jp and Jap.

In order to prevent the magnetization switching by a sense current flowing through the magnetic recording element in a read, a value smaller than the switching current Jap must be employed as the sense current value. Therefore, if asymmetry between the switching currents Jp and Jap is very large, the sense current value is much smaller than the value of the switching current Jp. Thus, it is preferable that asymmetry between two switching current values is small. In this embodiment, the spin polarization of the material of the pinned layer FP is increased while that of the free layer FF is reduced. By doing so, it is possible to reduce the switching current Jp more than the reduction of the switching current Jap to improve the asymmetry.

[1-3] Modification of Structure

The structure of the pin and free layers FP and FF will be described below in detail. FIG. 3 to FIG. 17 each schematically shows the cross-sectional structure applicable to the pin and free layers FP and FF shown in FIG. 1. Any of the structures shown in FIG. 3 to FIG. 17 is applicable to the pin and free layers FP and FF. In FIG. 3 to FIG. 17, an arrow shown in each sub-layer denotes the magnetization direction. FIG. 4 to FIG. 10 shows the case where the uppermost ferromagnetic sub-layer FM1 and the lowermost ferromagnetic sub-layer FM2 are ferromagnetically exchange-coupled. On the other hand, FIG. 11 to FIG. 17 shows the case where the uppermost ferromagnetic sub-layer FM1 and the lowermost ferromagnetic sub-layer FM2 areantiferromagnetically exchange-coupled.

Figure 17:
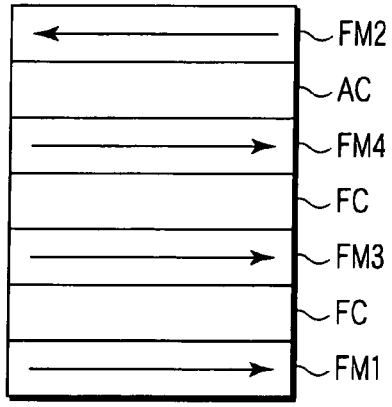
Figure 18:
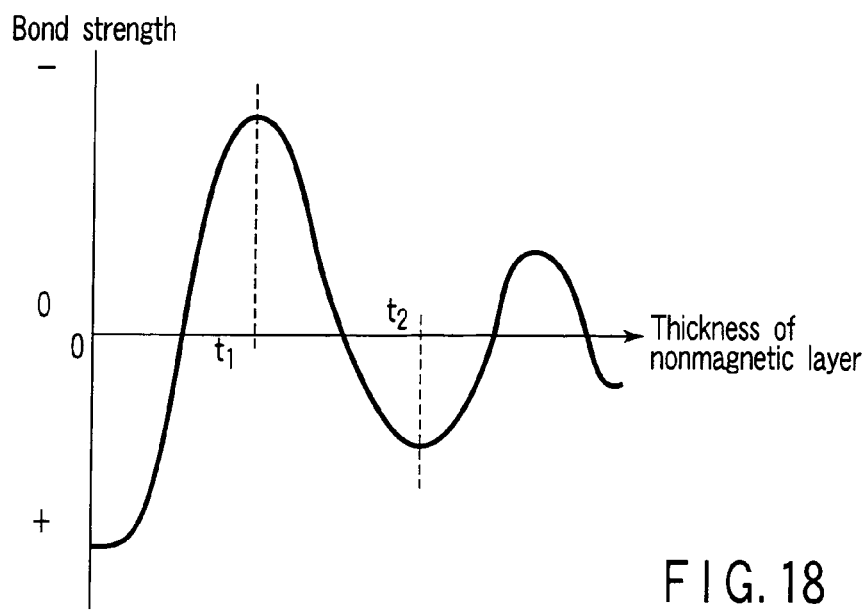
FIG. 18 shows the relationship between a thickness of a nonmagnetic layer and a bonding strength between two ferromagnetic layers sandwiching the nonmagnetic layer.

In general, exchange coupling between two ferromagnetic layers via nonmagnetic layer oscillates between positive and negative values according to the thickness of the nonmagnetic layer as schematically shown in FIG. 18. Therefore, the film thickness of the nonmagnetic sub-layer shown in FIG. 4 to FIG. 17 is set to any of positive or negative peak position in FIG. 18. By doing so, exchange coupling between ferromagnetic sub-layers adjacent to both sides of the nonmagnetic sub-layer can be ferromagnetic or antiferromagnetic. In FIG. 4 to FIG. 17, a nonmagnetic sub-layer FC has features of ferromagnetically coupling ferromagnetic sub-layers adjacent to both sides of the layer FC and has a film thickness adjusted to t2 shown in FIG. 18. A nonmagnetic sub-layer AC has features of antiferromagnetically coupling ferromagnetic sub-layers adjacent to both sides of the layer AC and has a film thickness adjusted to t1 shown in FIG. 18.

Each ferromagnetic sub-layer may have the structure stacked with several ferromagnetic films.

According to the structure shown in FIG. 3, one ferromagnetic sub-layer FM1 is only provided. According to the structure shown in FIG. 4, a nonmagnetic sub-layer FC is interposed between lowermost and uppermost ferromagnetic sub-layers FM1 and FM2. The ferromagnetic sub-layers FM1 and FM2 are ferromagnetically coupled to each other.

According to the structure shown in FIG. 5, a nonmagnetic sub-layer FC, ferromagnetic sub-layer FM3 and nonmagnetic sub-layer FC are stacked successively from the bottom between the ferromagnetic sub-layers FM1 and FM2. The ferromagnetic sub-layer FM3 is ferromagnetically coupled with the ferromagnetic sub-layers FM1 and FM2.

According to the structure shown in FIG. 6, a nonmagnetic sub-layer AC, ferromagnetic sub-layer FM3 and nonmagnetic sub-layer FC are stacked successively from the bottom between the ferromagnetic sub-layers FM1 and FM2. The ferromagnetic sub-layer FM3 is antiferromagnetically coupled with the ferromagnetic sub-layers FM1 and FM2.

According to the structure shown in FIG. 7, a nonmagnetic sub-layer FC, ferromagnetic sub-layer FM3, nonmagnetic sub-layer FC, ferromagnetic sub-layer FM4 and nonmagnetic sub-layer FC are stacked successively from the bottom between the ferromagnetic sub-layers FM1 and FM2. The ferromagnetic sub-layer FM3 is ferromagnetically coupled with the ferromagnetic sub-layers FM1 and FM4. The ferromagnetic sub-layer FM4 is ferromagnetically coupled with the ferromagnetic sub-layer FM2.

According to the structure shown in FIG. 8, a nonmagnetic sub-layer FC, ferromagnetic sub-layer FM3, nonmagnetic sub-layer AC, ferromagnetic sub-layer FM4 and nonmagnetic sub-layer AC are stacked successively from the bottom between the ferromagnetic sub-layers FM1 and FM2. The ferromagnetic sub-layer FM3 is ferromagnetically coupled with the ferromagnetic sub-layer FM1. The ferromagnetic sub-layer FM4 is ferromagnetically coupled with the ferromagnetic sub-layers FM2 and FM3.

Figure 9:
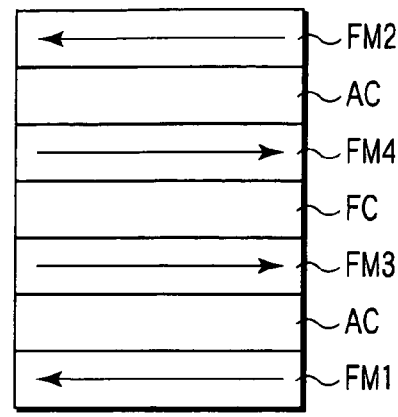

According to the structure shown in FIG. 9, a nonmagnetic sub-layer AC, ferromagnetic sub-layer FM3, nonmagnetic sub-layer FC, ferromagnetic sub-layer FM4 and nonmagnetic sub-layer AC are stacked successively from the bottom between the ferromagnetic sub-layers FM1 and FM2. The ferromagnetic sub-layer FM3 is antiferromagnetically coupled with the ferromagnetic sub-layer FM1 and is ferromagnetically coupled with the ferromagnetic sub-layer FM4. The ferromagnetic sub-layer FM4 is antiferromagnetically coupled with the ferromagnetic sub-layer FM2.

Figure 10:
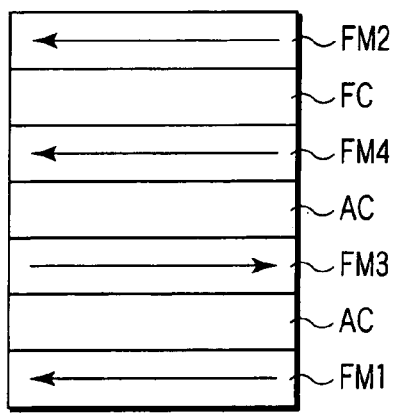

According to the structure shown in FIG. 10 a nonmagnetic sub-layer AC, ferromagnetic sub-layer FM3, nonmagnetic sub-layer AC, ferromagnetic sub-layer FM4 and nonmagnetic sub-layer FC are stacked successively from the bottom between the ferromagnetic sub-layers FM1 and FM2. The ferromagnetic sub-layer FM3 is antiferromagnetically coupled with the ferromagnetic sub-layers FM1 and FM4. The ferromagnetic sub-layer FM4 is ferromagnetically coupled with the ferromagnetic sub-layer FM2.

Figure 11:
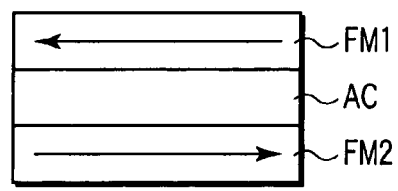

According to the structure shown in FIG. 11, a nonmagnetic sub-layer AC is interposed between ferromagnetic sub-layers FM1 and FM2. The ferromagnetic sub-layer FM1 is antiferromagnetically coupled to the ferromagnetic sub-layer FM2.

Figure 12:
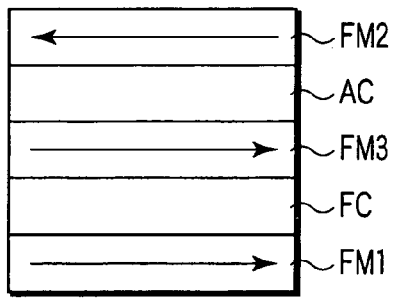

According to the structure shown in FIG. 12, nonmagnetic sub-layer FC, ferromagnetic sub-layer FM3 and nonmagnetic sub-layer AC are stacked successively from the bottom between the ferromagnetic sub-layers FM1 and FM2. The ferromagnetic sub-layer FM3 is ferromagnetically coupled with the ferromagnetic sub-layer FM1 and is antiferromagnetically coupled with the ferromagnetic sub-layer FM2.

Figure 13:
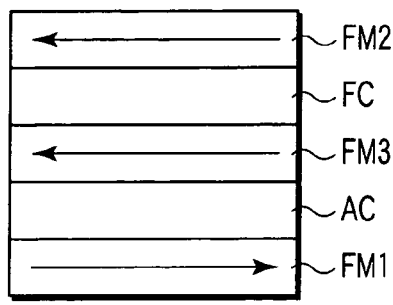

According to the structure shown in FIG. 13, nonmagnetic sub-layer AC, ferromagnetic sub-layer FM3 and nonmagnetic sub-layer FC are stacked successively from the bottom between the ferromagnetic sub-layers FM1 and FM2. The ferromagnetic sub-layer FM3 is antiferromagnetically coupled with the ferromagnetic sub-layer FM1 and is ferromagnetically coupled with the ferromagnetic sub-layer FM2.

Figure 14:
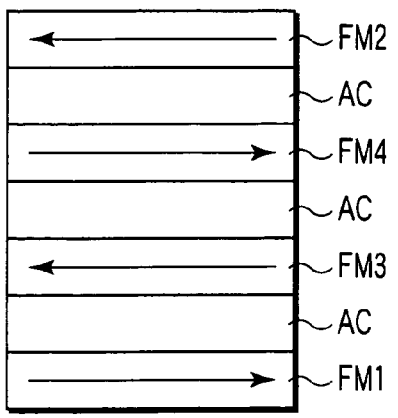

According to the structure shown in FIG. 14, a nonmagnetic sub-layer AC, ferromagnetic sub-layer FM3, nonmagnetic sub-layer AC, ferromagnetic sub-layer FM4 and nonmagnetic sub-layer AC are stacked successively from the bottom between the ferromagnetic sub-layers FM1 and FM2. The ferromagnetic sub-layer FM3 is antiferromagnetically coupled with the ferromagnetic sub-layers FM1 and FM4. The ferromagnetic sub-layer FM4 is antiferromagnetically coupled with the ferromagnetic sub-layer FM2.

Figure 15:
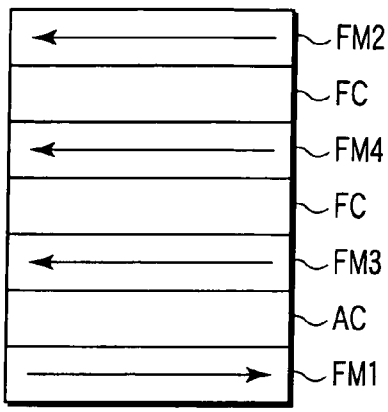

According to the structure shown in FIG. 15, a nonmagnetic sub-layer AC, ferromagnetic sub-layer FM3, nonmagnetic sub-layer FC, ferromagnetic sub-layer FM4 and nonmagnetic sub-layer FC are stacked successively from the bottom between the ferromagnetic sub-layers FM1 and FM2. The ferromagnetic sub-layer FM3 is antiferromagnetically coupled with the ferromagnetic sub-layer FM1 and is ferromagnetically coupled with the ferromagnetic sub-layer FM4. The ferromagnetic sub-layer FM4 is ferromagnetically coupled with the ferromagnetic sub-layer FM2.

Figure 16:
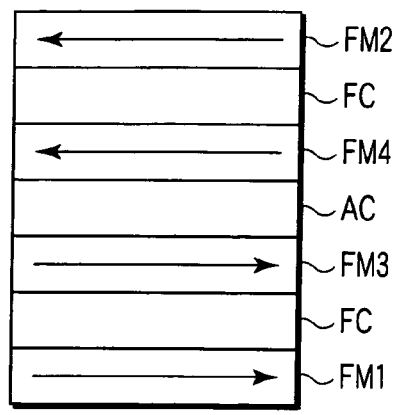

According to the structure shown in FIG. 16, a nonmagnetic sub-layer FC, ferromagnetic sub-layer FM3, nonmagnetic sub-layer AC, ferromagnetic sub-layer FM4 and nonmagnetic sub-layer FC are stacked successively from the bottom between the ferromagnetic sub-layers FM1 and FM2. The ferromagnetic sub-layer FM3 is ferromagnetically coupled with the ferromagnetic sub-layer FM1 and is antiferromagnetically coupled with the ferromagnetic sub-layer FM4. The ferromagnetic sub-layer FM4 is ferromagnetically coupled with the ferromagnetic sub-layer FM2.

According to the structure shown in FIG. 17 a nonmagnetic sub-layer FC, ferromagnetic sub-layer FM3, nonmagnetic sub-layer FC, ferromagnetic sub-layer FM4 and nonmagnetic sub-layer AC are stacked successively from the bottom between the ferromagnetic sub-layers FM1 and FM2. The ferromagnetic sub-layer FM3 is ferromagnetically coupled with the ferromagnetic sub-layers FM1 and FM4. The ferromagnetic sub-layer FM4 is antiferromagnetically coupled with the ferromagnetic sub-layer FM2.

When the pinned layer FP of FIG. 1 has the structures shown in FIG. 4 to FIG. 17, an antiferromagnetic layer AF (not shown) on the uppermost ferromagnetic sub-layer FM2 fixes the magnetization direction of the ferromagnetic sub-layer FM2. The magnetization direction of the ferromagnetic sub-layer FM2 is used as a base direction. On the basis of the base direction, each magnetization direction of the ferromagnetic sub-layers FM1, FM3 and FM4 is fixed to a unique direction via nonmagnetic sub-layers AC and FC in accordance with the structures shown in FIG. 4 to FIG. 17. In this case, the magnetization direction of the lowermost ferromagnetic sub-layer FM1 contacting with the intermediate layer S of FIG. 1 is regarded as the magnetization direction of the pinned layer FP. Of the spin polarization of the materials forming the ferromagnetic sub-layer(s) used in the pinned layer FP, the highest value is employed as the spin polarization of the pinned layer FP described in the embodiment.

When the free layer FF of FIG. 1 has the structures shown in FIG. 4 to FIG. 17, the magnetization direction of the ferromagnetic sub-layers FM1 to FM4 and nonmagnetic sub-layers AC and FC change to either of two directions while keeping their coupling in accordance with each structure. In this case, the magnetization direction of the uppermost ferromagnetic sub-layer FM2 may be set as the magnetization direction of the free layer FF. Of the spin polarization of the material forming the ferromagnetic sub-layer used in the free layer FF, the highest value is employed as the spin polarization of the free layer FF described in the embodiment.

Figure 19:
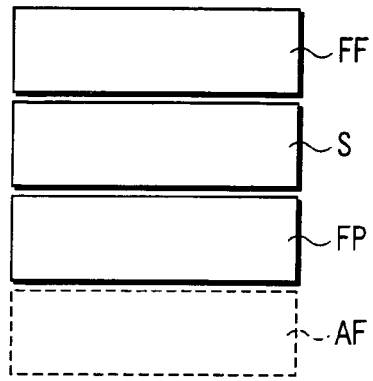
FIG. 19 schematically shows the cross-sectional structure of a magnetic recording element according to a modification of the first embodiment.

FIG. 19 schematically shows the cross-sectional structure of a magnetic recording element according to a modification of the first embodiment. The modification relates to the structure of inverting the top and bottom of the structure shown in FIG. 1. In order to fix the magnetization direction of a ferromagnetic layer FP in the element, the element is provided with an antiferromagnetic layer AF at the lowermost portion. The magnetic recording element is manufactured and used in the same manner as the element shown in FIG. 1. The effect of reducing the switching current according to the present invention is the same as the case of the element shown in FIG. 1. Of course, the stacked structures shown in FIG. 4 to FIG. 17 may be used as the pin and free layers FP and FF. In this case, the pin and free layers FP and FF, that is, the ferromagnetic sub-layer contacting with the intermediate layer S is referred as the magnetization direction of the pin and free layers FP and FF. Of the spin polarization of the material forming the ferromagnetic sub-layer used in the pinned layer FP, the highest value is employed as the spin polarization of the pinned layer FP. Of the spin polarization of the material forming the ferromagnetic sub-layer used in the free layer FF, the highest value is employed as the spin polarization of the free layer FF.

In the element shown in FIG. 1 or FIG. 19, the spin of the pinned layer FP may be fixed (pinned) toward the direction perpendicular to the junction surface of each layer. In this case, the current is carried in the direction crossing the junction surface, and thereby, the magnetization direction of the free layer FF is controlled to be parallel or antiparallel to the magnetization direction of the pinned layer FP. In this embodiment, the effect of reducing the switching current according to the present invention is the same as the case of the element shown in FIG. 1.

[1-4] Material and Film Thickness of Each Layer

Material, composition and film thickness of each layer forming the magnetic recording element will be described below.

Preferably, the following magnetic semiconductors are used as a material of the antiferromagnetic layer AF for fixing the magnetization of the ferromagnetic layer FP. The magnetic semiconductors are Fe—Mn, Pt—Mn, Pt—Cr—Mn, Ni—Mn, Pd—Mn, Pd—Pt—Mn, Ir—Mn, Pt—Ir—Mn, NiO, $Fe_2O_3$, etc.

Co, Fe, Ni or an alloy containing those may be used as the ferromagnetic layer FF, that is, a material having low spin polarization. Of these materials, one with higher polarization can reduce the switching current in the embodiment more greatly. The thickness of the pinned layer is preferred to be within a range from 0.6 to 100 nm.

Co, Fe, Ni or an alloy containing those may be used as the ferromagnetic layer FP, that is, a material having high spin polarization as in the ferromagnetic layer FF. It is known that iron-group transition metal such as Co, Fe, Ni or an alloy containing those has high spin polarization. Thus, these material may be used as a material of the pinned layer FP having spin polarization higher than the free layer FF. The thickness of the pinned layer is preferred to be within a range from 0.2 to 50 nm.

The spin polarization of the pinned layer FP is higher, in other word, ideally, as close as 1, and thereby, switching current reduction effect according to the embodiment is high. However, even if the spin polarization of the pinned layer FP does not reach or is near 1, the switching current reduction effect according to the embodiment is sufficiently obtained. When the density of states for the minority spin electrons is zero, the spin polarization is 1 based on the definition. Magnetic materials having the property described above are called half metal. The half metal has very high spin polarization as compared with the iron-group transition metal such as Co, Fe, Ni or an alloy containing those. Thus, the half metal is an ideal material for the pinned layer FP. The half metal includes the following materials:

Heusler's alloy MMn (M represents a mixed element consisting of at least two kinds of Ni, Fe, Cu, Cr, Pt, Pd, Sb, Sn, Al, Si and Ge);

Rutile type oxide $MO_2$ (M represents at least one of Ti, V, Cr, Sn, Mn, Fe, Ir and Ru);

Spinel type oxide $Mfe_2O_4$ (M represents at least one of Fe, Co and Ni);

Perovskite type manganese oxide $RMO3$ (R represents at least one of rare earth or alkaline earth elements, and M represents one of Mn, Fe, Ni, and Cr or mixed element containing one of them as a main component);

Double Perovskite type oxide such as $Sr_2FeMoO_6$ and $Sr_2CrReO_6$;

Zinc blende chromium compound such as CrAs and CrSb;

Pyrite type compound $MX_2$ (M represents transition metal, and X represents any of S, Se and Te);

Pyrochlore type manganese oxide such as $Tl_2Mn_2O_7$; and

Sendust alloy FeM (M represents a mixed element consisting of one kind or more of Al, Si, Ga, Ge, Ti, V, Zr, Nb, Hf, Ta, rare earth and alkaline earth.

These materials significantly have high spin polarization as compared with the iron-group transition metal such as Co, Fe, Ni or an alloy containing those. Therefore, these materials are an ideal material for the pinned layer FP because switching current reduction effect according to the embodiment remarkably appears.

These magnetic materials may be added (doped) with the following nonmagnetic elements to control magnetic property and various physical properties such as crystallinity, mechanical and chemical characteristics. The nonmagnetic elements are Ag (silver), Cu (copper), Au (gold), Al (aluminum), Mg (magnesium), Si (silicon), Bi (bismuth), Ta (tantalum), B (boron), C (carbon), 0 (oxygen), N (nitrogen), Pd (palladium), Pt (Platinum), Zr (zirconium), Ir (iridium), W (tungsten), Mo (molybdenum), Nb (niobium), H (hydrogen), etc.

If the pin or free layer FP or FF has the multilayer film structures shown in FIG. 4 to FIG. 17, Cu, Au, Ag, Ru, Ir, Os or an alloy containing any one of those elements or more may be used as the material of nonmagnetic sub-layers FC and AC.

If nonmagnetic metal is used as the intermediate layer S of FIG. 1, any of Au, Cu, Cr, Zn, Ga, Nb, Mo, Ru, Pd, Ag, Hf, Ta, W, Pt and Bi or an alloy containing any one of those elements or more may be used. The thickness of the nonmagnetic metal intermediate layer S is preferably set within a range from 0.2 to 20 nm.

The following materials may be used in order that the intermediate layer S functions as a tunnel barrier layer. The materials are $Al_2O_3$ (aluminum oxide), $SiO_2$ (silicon oxide), MgO (magnesium oxide), AlN (aluminum nitride), $Bi_2O_3$ (bismuth oxide), $MgF_2$ (magnesium fluoride), $CaF_2$ (calcium fluoride). Further, the materials are $SrTiO_2$ (titanium-strontium oxide), $AlLaO_3$ (lanthanum-aluminum oxide), Al—N—O (aluminum oxynitride) and nonmagnetic semiconductors (ZnO, InMn, Ga, N, GaAs, $TiO_2$, Zn, Te or these compounds doped with transition metal). These compounds have no need to stoichiometrically have fully accurate composition, and may have defect of oxygen, nitrogen or fluorine or have both too much and too little. Magnetoresistive effect via the tunnel barrier layer is high; therefore, insulator or semiconductor may be used as the intermediate layer S to realize a large read margin.

Examples of the present embodiment will be described below.

[1-5] EXAMPLE 1-1

Magnetic recording element samples 1 (Example 1-1), 2 (comparative example 1) and 3 (comparative example 2) were manufactured as one example of the first embodiment. These magnetic recording element samples 1 to 3 have the structure shown in FIG. 1 and the material given below. The following is the case where an electrode (interconnect) EL1 is provided above the pinned layer FP while an electrode (interconnect) EL2 is provided below the free layer FF although not shown in FIG. 1. In the following description, the left side of ":" represents a material and the right side thereof represents a film thickness.

Sample 1: Electrode EL1 (Cu)/antiferromagnetic layer AF (PtMn: 20 nm)/pinned layer FP ($Fe_3O_4$: 10 nm)/intermediate layer S (Cu: 6 nm)/free layer FF (Co: 3 nm)/electrode EL2 (Cu)

Sample 2: Electrode EL1 (Cu)/antiferromagnetic layer AF (PtMn: 20 nm)/pinned layer FP (Fe$_3$O$_4$: 10 nm)/intermediate layer S (Cu: 6 nm)/free layer FF (Fe$_3$O$_4$: 3 nm)/electrode EL2 (Cu)

Sample 3: Electrode EL1 (Cu)/antiferromagnetic layer AF (PtMn: 20 nm)/pinned layer FP (Co: 10 nm)/intermediate layer S (Cu: 6 nm)/free layer FF (Co: 3 nm)/electrode EL2 (Cu)

These magnetic recording elements were prepared via the following process. Firstly, a bottom electrode EL2 was formed above a wafer. A stacked structure comprising the free layer FF, intermediate layer S, pinned layer FP and antiferromagnetic layer AF was formed on the bottom electrode EL using a super-high vacuum sputtering system. A tantrum (Ta) protection film was further formed on the stacked structure. The wafer was magnetic-annealed using a magnetic vacuum furnace at a temperature of 270° C. for ten hours so that unidirectional anisotropy was given to ferromagnetic layers. EB (electron beam) resist was coated to the protection film and subjected to EB exposure, and thereafter, a mask corresponding to the shape of the magnetic recording element was formed using a lift off method. Regions coated with no mask are etched using an ion milling system. The cell processing size was 100 nm×50 nm.

After etching, the mask was removed, and further, a SiO$_2$ film was formed among cells. Then, the surface was planarized using ion milling, and a so-called "projecting" process of exposing the surface of tantrum film was carried out. A top electrode EL1 was formed on the surface of tantrum film. As a result, a magnetic recording element equivalent to FIG. 1 was formed.

In the samples thus obtained, a magnetization switching current value of the free layer FF was calculated from a change of resistance by a current flowing in a direction perpendicular to the junction surface of each layer. As a result, of positive and negative switching currents, the mean of the value having the smaller absolute value was as follows.

Sample 1: 0.9 mA
Sample 2: 2.5 mA
Sample 3: 5.0 mA

The mean of a ratio of the absolute value of the positive and negative switching currents was as follows.

Sample 1: 2.5
Sample 2: 55.0
Sample 3: 4.2

The material having spin polarization higher than the free layer FF is used as the pinned layer FP, and thereby, the switching current decreased. Moreover, it is possible to alleviate the problem of asymmetry of positive and negative switching currents in the absolute value.

The following magnetic recording element was manufactured as another example via the same process as the sample 1. The magnetic recording element has the same material and thickness as the sample, and has the structure shown in FIG. 19, that is, the structure inverting the top and bottom of the element. This element also brought the same effect as the sample 1, that is, switching current reduction effect.

[1-6] EXAMPLE 1-2

The following magnetic recording element sample was manufactured as one example of the first embodiment via the same process as the example 1. The magnetic recording element has the structure shown in FIG. 1 using a series of Ni$_x$Cu$_{1-x}$ alloy as the free layer FF. In the Ni$_x$Cu$_{1-x}$ alloy, a ratio of Ni is changed little by little. The cell processing size was 100 nm×50 nm.

Sample series 1: Electrode EL1 (Cu)/antiferromagnetic layer AF (PtMn: 20 nm)/pinned layer FP (Co: 10 nm)/intermediate layer S (Cu: 6 nm)/free layer FF (Ni$_x$Cu$_{1-x}$: 3 nm)/electrode EL2 (Cu)

Sample series 2: Electrode EL1 (Cu)/antiferromagnetic layer AF (PtMn: 20 nm)/pinned layer FP (Ni: 10 nm)/intermediate layer S (Cu: 6 nm)/free layer FF (Ni$_x$Cu$_{1-x}$: 3 nm)/electrode EL2 (Cu)

Where, x=0.5, 0.6, 0.7, 0.8, 0.9, 1.0

Figure 20:
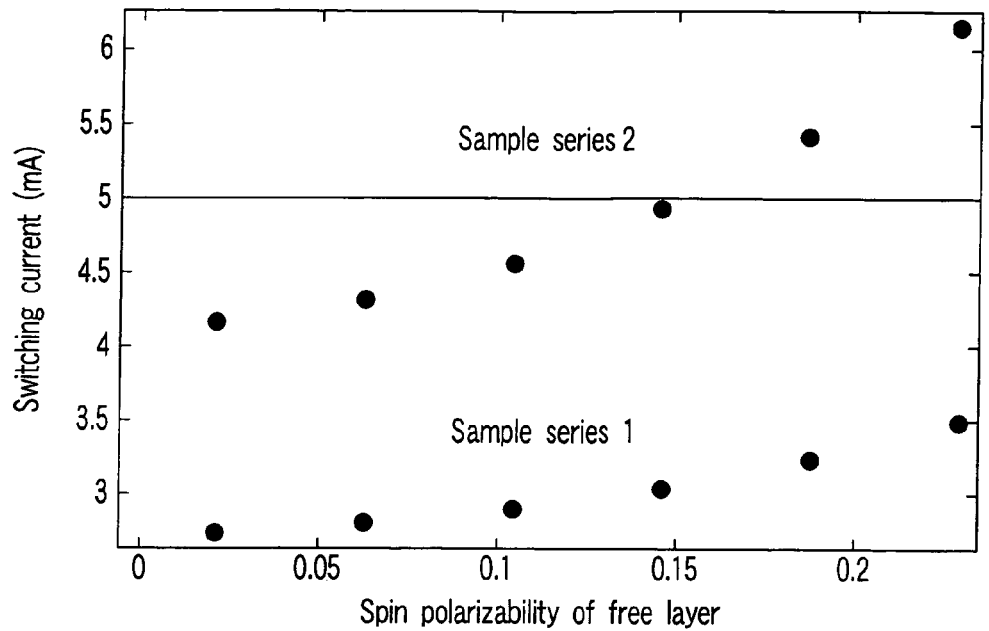
FIG. 20 shows the relationship between the spin polarization of the free layer in an embodiment 1-2 and switching current.

It is known that the Ni$_x$Cu$_{1-x}$ alloy is nonmagnetic when x<0.45 and ferromagnetic when x>0.45. Therefore, when x=0.45, the spin polarization Pf of the free layer FF is 0. When x=1.0, the spin polarization Pf is 0.23. Thus, spin polarization Pf of the foregoing samples is 0.02, 0.06, 0.10, 0.15, 0.19, 0.23, respectively. In samples belonging to sample series 1 and 2, a switching current value was calculated from a change of resistance by a current flowing in direction perpendicular to the film surface. As a result, the means of the switching current having the smaller absolute value was shown in FIG. 20. In FIG. 20, the value (5.0 mA) of the sample 3 of the Example 1 is shown as the comparative example together. From the result of the sample series 1, it can be seen that the switching current decreases according to the effect of the present embodiment. Likewise, from the result of the sample series 2, it can be seen that the switching current decrease according to the effect of the present embodiment. In particular, when Pf≦0.15, the switching current is lower than the sample 3 of the Example 1-1. In the sample 3 of the Example 1-1, spin polarization Pp of the pinned layer FP and spin polarization Pf of the free layer FF, were 0.35 and 0.35, respectively and Pp and Pf were 0.23 and 0.15, respectively, in the present Example to realize the same switching current as the Example 1-1. Therefore, the following equation is given as an approximating condition for reducing the switching current more than the sample 3 of the Example 1-1.

$$Pp \geq 0.6Pf + 0.14$$

[1-7] EXAMPLE 1-3

Magnetic recording element samples 1 to 3 (Example 1-3) and sample 4 (comparative example) were manufactured via the same process as one example of the first embodiment. These magnetic recording element samples 1 to 4 have the structure shown in FIG. 1 and the material given below. The cell processing size was 100 nm×50 nm.

Sample 1: Electrode EL1 (Cu)/antiferromagnetic layer AF (PtMn: 20 nm)/pinned layer FP (La$_{0.7}$Sr$_{0.3}$MnO$_3$: 10 nm)/intermediate layer S (Cu: 6 nm)/free layer FF (Co: 3 nm)/electrode EL2 (Cu)

Sample 2: Electrode EL1 (Cu)/antiferromagnetic layer AF (PtMn: 20 nm)/pinned layer FP (La$_{0.7}$Sr$_{0.3}$MnO$_3$: 10 nm)/intermediate layer S (Cu: 6 nm)/free layer FF (NiMnSb: 3 nm)/electrode EL2 (Cu)

Sample 3: Electrode EL1 (Cu)/antiferromagnetic layer AF (PtMn: 20 nm)/pinned layer FP (La$_{0.7}$Sr$_{0.3}$MnO$_3$: 10 nm)/intermediate layer S (Cu: 6 nm)/free layer FF (La$_{0.7}$Sr$_{0.3}$MnO$_3$: 3 nm)/electrode EL2 (Cu)

Sample 4: Electrode EL1 (Cu)/antiferromagnetic layer AF (PtMn: 20 nm)/pinned layer FP (NiMnSb: 10 nm)/intermediate layer S (Cu: 6 nm)/free layer FF (NiMnSb: 3 nm)/electrode EL2 (Cu)

From the table shown in FIG. 2, the materials NiMnSb and $La_{0.7}Sr_{0.3}MnO_3$ have spin polarization of 0.58 and 0.78, respectively. In the samples thus prepared, the mean of a ratio of the absolute value of positive and negative switching currents was as follows.

Sample 1: 2.6
Sample 2: 7.4
Sample 3: 17.1
Sample 4: 10.6

Figure 21:
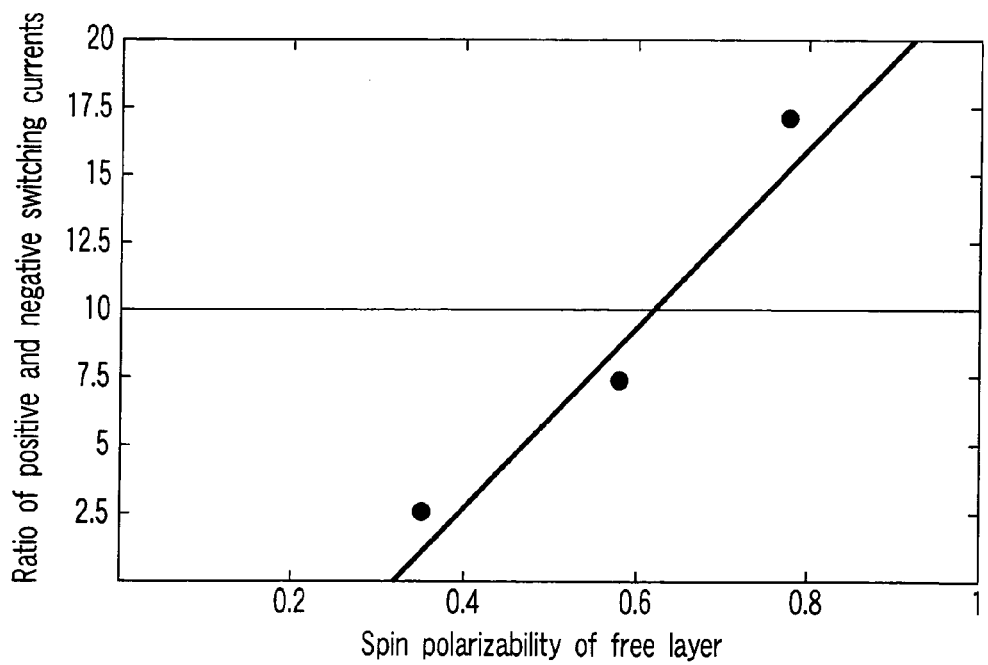
FIG. 21 shows the relationship between the spin polarization of the free layer in an embodiment 1-3 and a ratio of positive and negative switching currents.

It is preferable that the ratio of the absolute value of the positive and negative switching currents approximates 1. A target value of the ratio is, however, a single digit difference, that is, within ten times. The samples 1 to 3 are elements having the same structure and material except that the material of the free layer FF is different. These samples were plotted taking the spin polarization of the free layer FF as the horizontal axis and taking the mean of the ratio between the absolute values of positive and negative switching currents as the vertical axis. Then, the straight line was fitted therein. The result is shown in FIG. 21. From the FIG. 21, the following matter can be seen. The ratio of the absolute value of positive and negative switching currents becomes 10 where the spin polarization Pf of the free layer FF becomes 0.62 if the spin polarization Pf of the pinned layer PF is 0.78. In the sample 4 prepared as the comparative example and having pin and free layers FP and FF whose spin polarization is 0.58, the ratio of the absolute value of positive and negative switching currents was approximately 10. From the foregoing value, it can be seen that the following equation is given as a restricting condition for improving asymmetry of switching current.

$$Pp \geq 5.0 Pf - 2.4$$

Figure 22:
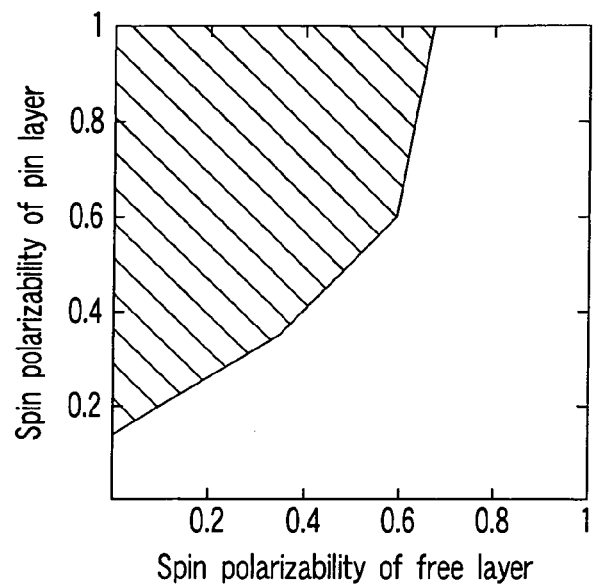
FIG. 22 shows the relationship in spin polarization between free and pinned layers of the magnetic recording device according to the first embodiment.

From Example 1-2 and 1-3, when spin polarization Pp and Pf of the pin and free layers FP and FF satisfies the equations $Pp \geq 0.6 Pf+0.14$ and $Pp \geq 5.0 Pf-2.4$, then it is possible to produce a magnetic recording element having little the magnetization switching current and small difference between positive and negative two switching currents. FIG. 22 shows a range of the spin polarization Pf and Pp satisfying the conditions.

[1-8] Advantage

In the magnetic recording element according to the first embodiment of the present invention, the spin polarization Pp of the pinned layer FP is larger than the spin polarization Pf of the free layer FF. Therefore, it is possible to produce a magnetic recording element having little switching current and small difference between the positive and negative two switching currents. In particular, the equations $Pp \geq 0.6 Pf+0.14$ and $Pp \geq 5.0 Pf-2.4$ are satisfied, and thereby, further enhanced effect is obtained. In other words, the equation $Pp \geq 0.6 Pf+0.14$ is satisfied, thereby reducing a current required for switching the free layer having the magnetization direction parallel to the pinned layer FP having the magnetization direction fixed to the first direction. Furthermore, the equation $Pp \geq 5.0 Pf-2.4$ is satisfied, and thereby, the difference between positive and negative switching currents is small.

(2) SECOND EMBODIMENT

The second embodiment relates to the structure having two pinned layers.

[2-1] Structure

Figure 23:
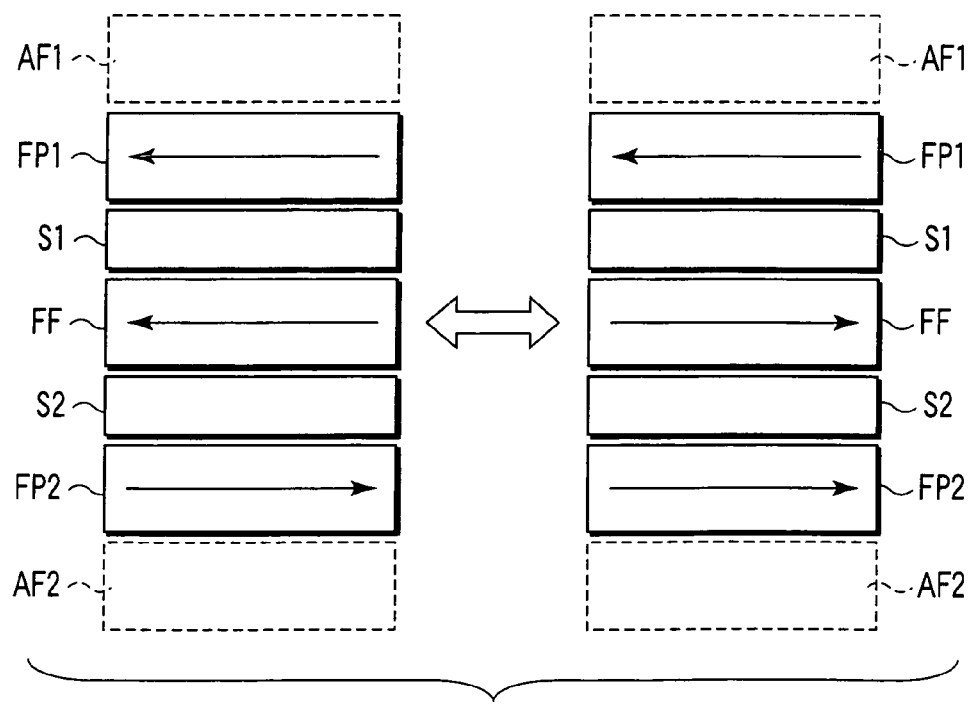
FIG. 23 and FIG. 24 each schematically show the cross-sectional structure of a magnetic recording device according to a second embodiment of the present invention.
Figure 24:
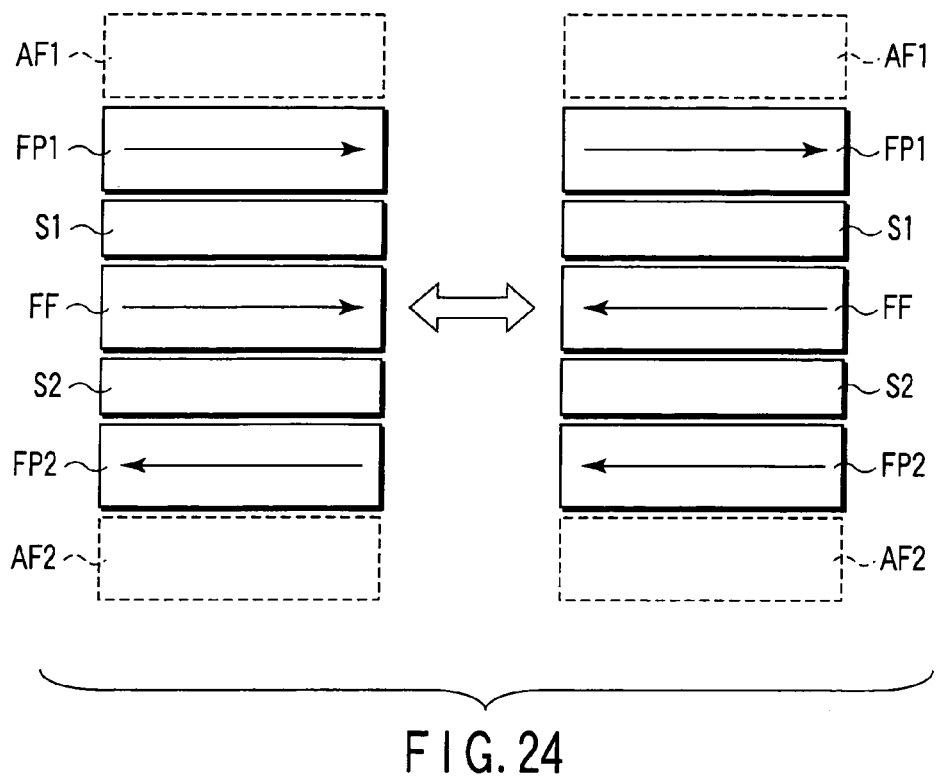

FIG. 23 and FIG. 24 schematically show the cross-sectional structure of magnetic recording devices according to a second embodiment of the present invention. These magnetic recording devices have, as a basic structure, element structure in which a ferromagnetic layer FP2, intermediate layer (nonmagnetic layer) S2, ferromagnetic layer (free layer) FF, intermediate layer (nonmagnetic layer) S1 and pinned layer FP1 are stacked successively from the bottom. The free layer FF, pinned layers FP1 and FP2 may have the stacked structure comprising several sub-layers as described later like the first embodiment. In the following description, the case where each of the free layer FF, pinned layers FP1 and FP2 is a single layer is given as an example.

Each magnetization direction of the pinned layers FP1 and FP2 is fixed by providing an antiferromagnetic layers AF1 above the pinned layer FP1 and providing antiferromagnetic layer AF2 below the pinned layer FP2. In the following description, the pinned layers FP1 and FP2 call a pinned layer.

The magnetization direction of one of the pinned layers FP1 and FP2 is parallel to that of the free layer FF. The magnetization direction of the other of the pinned layers FP1 and FP2 is antiparallel to that of the free layer FF. In FIG. 23 and FIG. 24, the direction shown by an arrow denotes the magnetization direction of each layer. FIG. 23 shows cases where the magnetization direction of the free layer FF is parallel to that of the pinned layer FP (left side of FIG. 23) and where the magnetization direction of the free layer FF is antiparallel to that of the pinned layer FP (right side of FIG. 23). In any case, one of the relationships in the magnetization direction between free and pinned layers FF and FP1 and between free and pinned layers FF and FP2 is parallel while the other thereof is antiparallel. FIG. 24 has the same relationship as described.

A current is carried in a direction crossing the junction surface of each layer, and thereby, the magnetization direction of the free layer FF is controlled. Furthermore, two pinned layers FP1 and FP2 sandwich the free layer FF as described above. This structure allows a current to give force to the magnetization of the free layer FF at least twice as large as the one applied in the structure including only one pinned layer FP1 or FP2. The explanation is given for the case where the case where electrons flow from the pinned layer FP2 to the pinned layer FP1. In this case, the electrons having passed through the pinned layer FP2 contribute to magnetization switching in the free layer FF and the electrons having passed through the free layer FF and been reflected by the pinned layer FP1 contribute to magnetization switching in the free layer FF. Therefore, binary data "0" or "1" is allocated in accordance with the magnetization direction of the free layer FF, and thereby, one element can record one-bit data.

At least one of the pinned layers, FP1, FP2 and free layer FF uses a material having spin polarization different from other two layers like the first embodiment. If the pinned layers FP1 and FP2 have the same spin polarization at least, the spin polarization of the pinned layer FP1 (or pinned layer FP2) is higher than that of the free layer FF. On the other hand, if the pinned layers FP1 and FP2 have different spin polarization, the smaller spin polarization is set less than the spin polarization of the free layer FF.

Figure 25:
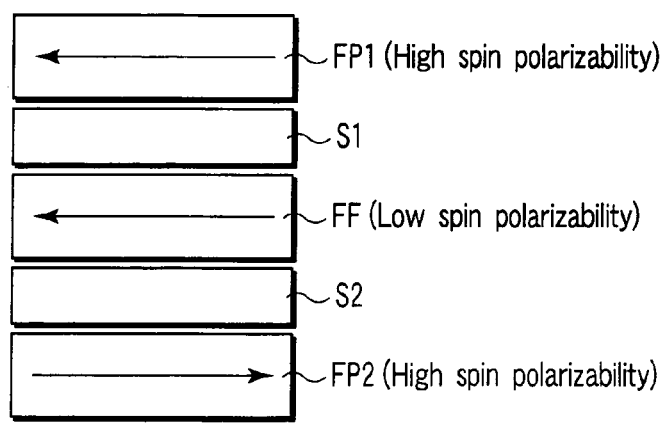
FIGS. 25, 26 and 27 each schematically shows a typical correlation in spin polarization between pin and free layers.
Figure 26:
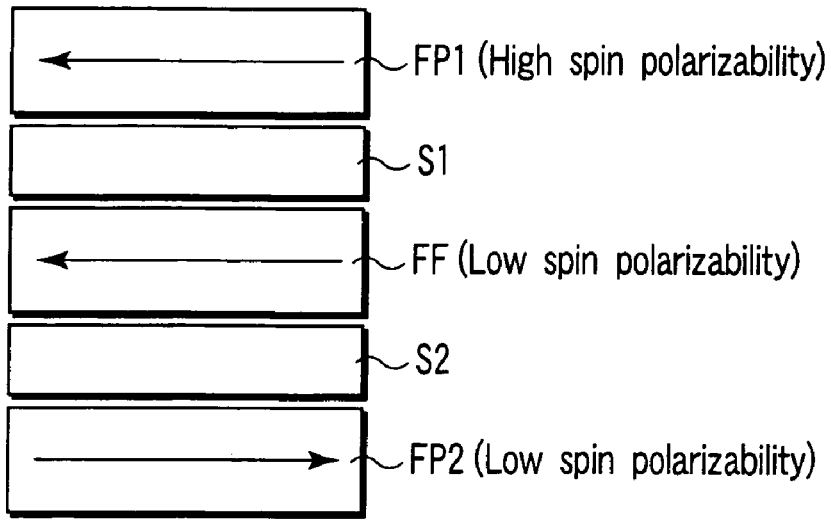
Figure 27:
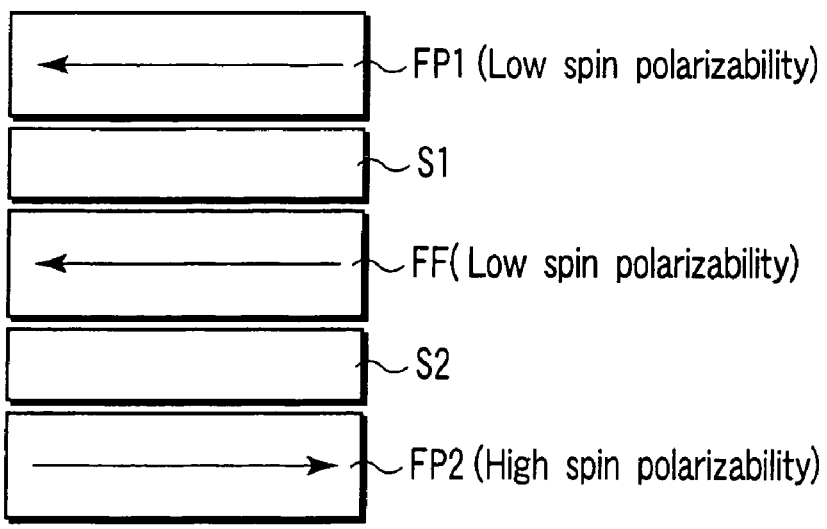
Figure 28:
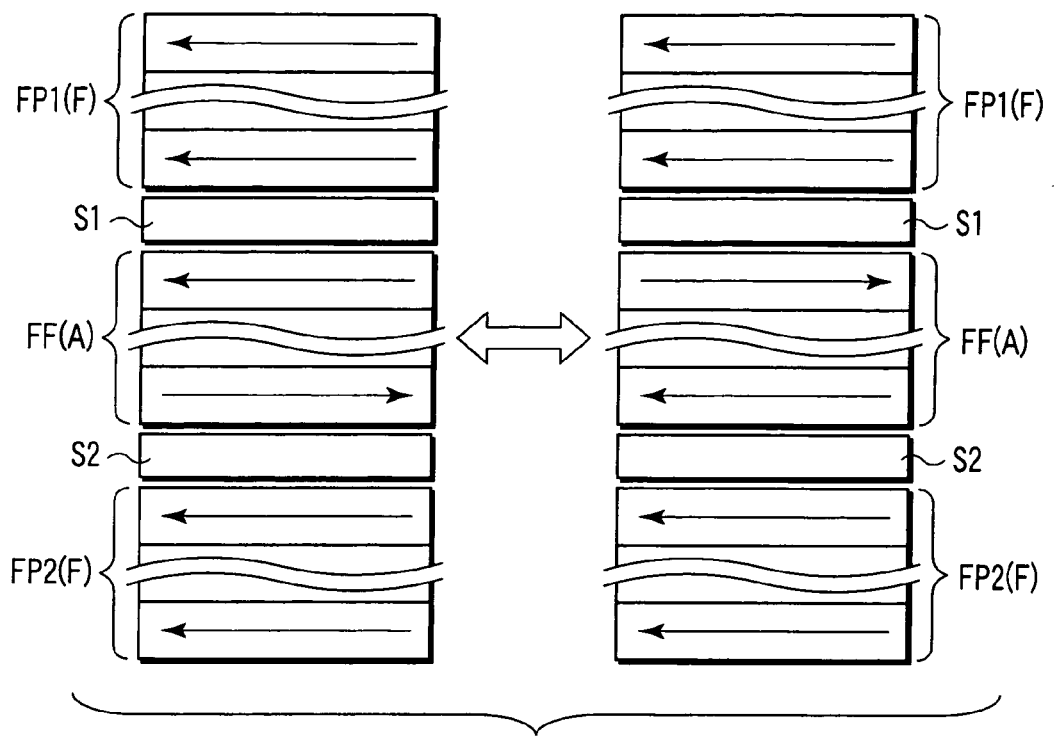
Figure 29:
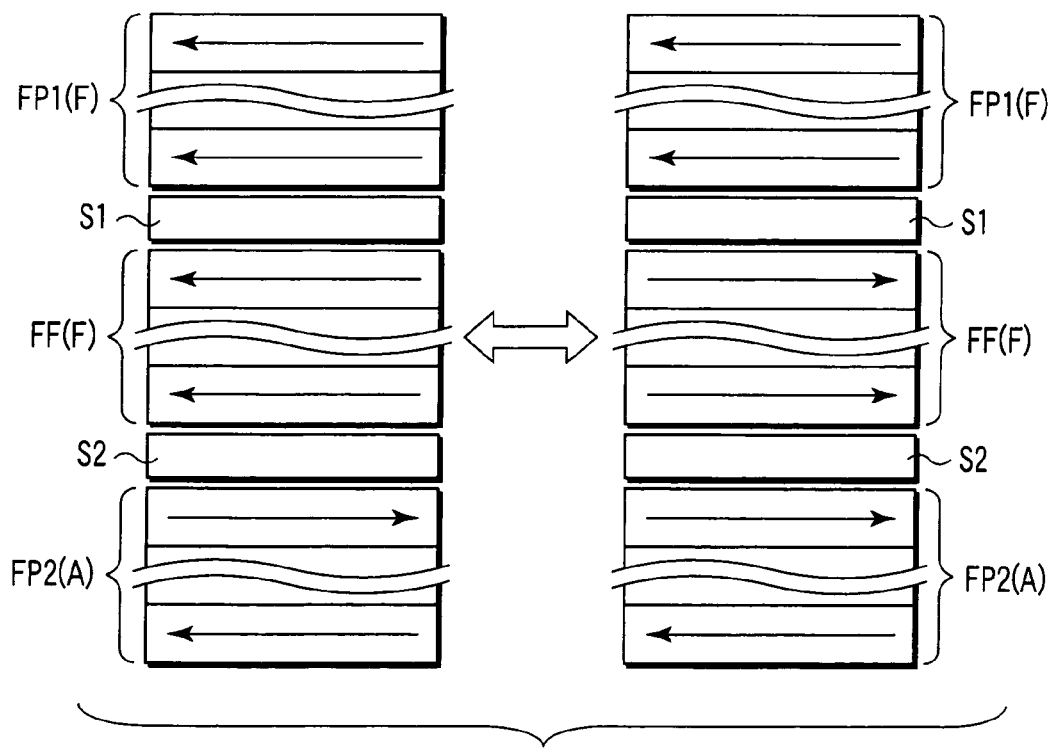

Typically, any of the three states shown in FIG. 25 to FIG. 27 is given as a relationship among pinned layer FP1, FP2 and free layer FF. The magnetization direction of each layer will be used in the following explanations. In the case of FIG. 25, the pinned layers FP1 and FP2 use a material having spin polarization different from that of the free layer FF. Each of the spin polarization of the pinned layers FP1 and FP2) is higher than that of the free layer FF. In the case of FIG. 26, the free layer FF and the pinned layer FP2 use a material having the same spin polarization, and the value is smaller than the spin polarization of the pinned layer FP1. In the case of FIG. 27, the free layer FF and the pinned layer FP1 use a material having the same spin polarization, and the value is smaller than the spin polarization of the pinned layer FP2.

The antiferromagnetic layers AF1, AF2, free layer FF, pinned layers FP1, FP2, intermediate layers S1 and S2 may use the same material and film thickness as the antiferromagnetic layers AF, free layer FF, pinned layer FP and intermediate layer S of the first embodiment. (See the [1-4], Material and thickness of each layer)

The element is manufactured using sputtering and lithography techniques. The details will be described in the following Examples.

[2-2] Write

The method of writing and reading data in the element will be described below.

Current is carried in a direction perpendicular to the junction surface of each layer and in accordance with the element structure and the magnetization direction of the free layer after switching in order to switch the magnetization direction of the free layer FF. In other words, electrons are made to flow from either of pinned layers FP1 and FP2 having magnetization direction antiparallel to that of the free layer before switching toward the free layer FF.

The writing will be explained below with reference to FIG. 25 to FIG. 27. As shown in FIG. 25 to FIG. 27, electrons are made to flow from the pinned layer FP2 toward the pinned layer FP1 in order to switch the magnetization direction of the free layer FF from a state parallel to the magnetization direction of the pinned layer FP1 to a state antiparallel to it.

In the case of FIG. 25, the spin polarization of the pinned layer FP2 is high. Therefore, most of the electrons flowing out of the pinned layer FP2 have spin parallel to the magnetization direction of the pinned layer FP2 as compared with the case where the pinned layer FP2 has low spin polarization (Effect 1). The spin parallel to the magnetization direction of the pinned layer FP2 (antiparallel to the magnetization direction of the free layer FF) switches the magnetization direction of the free layer FF. Moreover, the spin polarization of the pinned layer FP1 is high. Therefore, most of the electrons having spin antiparallel to the magnetization direction of the pinned layer FP1 are reflected by the pinned layer FP1, and thereafter, flow into the free layer FF again (Effect 2) to contribute to magnetization direction switching of the free layer FF. On the basis of the same principle as the first embodiment, the effects are combined, and thereby, switching current is largely reduced. The spin polarization of both the pinned layers FP1 and FP2 is high; therefore, the same effect as above is obtained even if the electrons flow in a reverse direction to the above. Namely, the difference between switching currents which have the opposite carrying direction of the electrons is very small (approximates 0).

In the case of FIG. 26, the spin polarization of the pinned layer FP2 is low (e.g., the same as the free layer FF). For this reason, of electrons flowing out of the pinned layer FP2, electrons having spin parallel to the magnetization direction of the pinned layer FP2 are not so much. Therefore, the switching current reduction effect resulting from the Effect 1 is not obtained. However, the spin polarization of the pinned layer FP1 is high; therefore, the switching current reduction effect resulting from the Effect 2 is obtained.

In the case of FIG. 27, electrons are injected from the pinned layer FP2 having high spin polarization; therefore, the switching current is reduced resulting from the Effect 1. On the other hand, the spin polarization of the pinned layer FP1 is low; for this reason, electrons reflected by the pinned layer FP1 are not so much. As a result, the switching current reduction effect resulting from the foregoing Effect 2 is no desirable.

In the structure having two pinned layers, the spin polarization of one of the two pinned layers is set higher than that of the free layer. By doing so, the switching current is reduced resulting from any of the Effects 1 and 2 in accordance with the electronic current direction. Therefore, asymmetry of switching current value corresponding to the polarity of switching current is further relaxed as compared with the structure having a single pinned layer. Moreover, the spin polarization of both the two pinned layers is set higher than that of the free layer, and thereby, the switching current is further reduced resulting from the Effects 1 and 2. In this case, asymmetry of switching current magnitude corresponding to the polarity of switching current is extremely small.

The read is the same as described in the first embodiment; therefore, the explanation is omitted.

[2-3] Modification of Structure

The following is a description of the case where the foregoing pin and free layers FP and FF have the stacked structure.

FIG. 28 to FIG. 31 each schematically shows the cross-sectional structure realized by a structure of stacking pinned layer FP1, free layer FF and pinned layer FP2 of the magnetic recording element according to the second embodiment. As depicted in FIG. 28 to FIG. 31, the pinned layer FP1, free layer FF and pinned layer FP2 have the stacked structure. In each structure, all the magnetic sublayers which composes the pinned layers have fixed magnetization directions. The magnetization directions of the sublayers which composes the free layer can take two opposite directions under the constraint that the relative angle between any two sublayers thereof is fixed, which implies that there are two states as for the free layer. In each of the two states, the two magnetic sublayers which contacts with the nonmagnetic layer S1, one of which composes the pinned layer FP1 and the other composes the free layer FF, have magnetizations whose directions are parallel or antiparallel to each other. Similar relationship holds for the two magnetic sublayers which contact with the nonmagnetic layer S2. Namely, their magnetization directions are parallel or antiparallel to each other. Furthermore, it is preferable for the relationship between the sublayers contacting with S1 is different from that between the sublayers contacting with S2, since the efficiency of the spin-transfer torque is enhanced compared with the case where this condition is not satisfied.

The structures shown in FIG. 28 to FIG. 31 are given as a combination of satisfying the condition described above. In FIG. 28 to FIG. 31, "(F)" appended to reference numerals FP1, FP2 and FF means that the uppermost and lowermost sub-layers of the pinned layer FP1, free layer FF and pinned layer FP2 are ferromagnetically exchange-coupled. Likewise, "(A)" means that the uppermost and lowermost sublayers are antiferromagnetically exchange-coupled. Any of the structures shown in FIG. 4 to FIG. 10 may be used as a layer appended with "(F)". On the other hand, any of the structures shown in FIG. 11 to FIG. 17 may be used as a layer appended with "(A)". Moreover, each sub-layer may have the material and film thickness described in the item of [1-4], Material and film thickness of each layer.

Of course, any one or only two of the pinned layer FP1, free layer FF and pinned layer FP2 having the structure shown in FIG. 23 or FIG. 24 may have the stacked structure. In this case, the magnetization direction is determined so that one of the following magnetization direction correlations is antiparallel while the other thereof is parallel. One is a magnetization direction correlation between two ferromagnetic layers or sub-layers contacting with an intermediate layer S1. Another is a magnetization direction correlation between two ferromagnetic layers or sub-layers contacting with an intermediate layer S2.

[2-4] EXAMPLE 2-1

Magnetic recording element samples 1, 2 (Example 2-1) and 3 (comparative example) were manufactured as one example of the second embodiment via the same process as the Example 1-1. These magnetic recording element samples 1 to 3 have the structures shown in FIG. 23 and FIG. 24 and the material given below. The cell processing size was 100 nm×50 nm.

Sample 1: Electrode EL1 (Cu)/antiferromagnetic layer AF1 (PtMn: 20 nm)/pinned layer FP1 ($CrO_2$: 10 nm)/intermediate layer S1 (Cu: 6 nm)/free layer FF (Co: 3 nm)/intermediate layer S2 (Cu: 2 nm)/pinned layer FP2 ($CrO_2$: 10 nm)/antiferromagnetic layer AF2 (PtMn: 20 nm/electrode EL2 (Cu)

Sample 2: Electrode EL1 (Cu)/antiferromagnetic layer AF1 (PtMn: 20 nm)/pinned layer FP1 ($CrO_2$: 10 nm)/intermediate layer S1 (Cu: 6 nm)/free layer FF (Co: 3 nm)/intermediate layer S2 (Cu: 2 nm)/pinned layer FP2 (Co: 10 nm)/antiferromagnetic layer AF2 (PtMn: 20 nm/electrode EL2 (Cu)

Sample 3: Electrode EL1 (Cu)/antiferromagnetic layer AF1 (PtMn: 20 nm)/pinned layer FP1 (Co: 10 nm)/intermediate layer S1 (Cu: 6 nm)/free layer FF (Co: 3 nm)/intermediate layer S2 (Cu: 2 nm)/pinned layer FP2 (Co: 10 nm)/antiferromagnetic layer AF2 (PtMn: 20 nm/electrode EL2 (Cu)

For each samples thus obtained, a switching current value of the free layer FF was obtained from a change of the resistance to a current flowing in a direction perpendicular to the junction surface of each layer. As a result, the mean of the switching current having the smaller absolute value was as follows.

Sample 1: 0.03 mA
Sample 2: 0.2 mA
Sample 3: 0.6 mA

The mean of a ratio of the absolute value of the positive and negative switching currents was as follows.

Sample 1: 1.0
Sample 2: 1.3
Sample 3: 1.0

In other words, the material having spin polarization higher than the free layer FF is used as the pinned layers FP and (or) FP2, and thereby, switching current is reduced. Moreover, if the material having higher spin polarization is used as both the pinned layers FP1 and FP2, the effect is given in remarkable. Asymmetry of the absolute value of positive and negative switching currents did not appear. This is because the structural symmetry is high in the second embodiment.

[2-5] EXAMPLE 2-2

Magnetic recording element samples 1 to 3 (Example 2-2) using an insulator as one of the intermediate layers and 4 (comparative example) were manufactured as one example of the second embodiment. Using insulator as one of the intermediate layers enables the magnetoresistive effect to be readily detected. The samples were manufactured via the same process as that used in the Example 1-1. The cell processing size was 100 nm×50 nm. In the following description, if several materials and thickness are partitioned by a mark "/" shown in one layer "( )", this means that the layer comprises a stacked film.

Sample 1: Electrode EL1 (Cu)/antiferromagnetic layer AF1 (PtMn: 20 nm)/pinned layer FP1 ($Fe_3O_4$: 10 nm)/intermediate layer S1 (Cu: 6 nm)/free layer FF (Co: 2 nm/CoFeNi: 1 nm)/intermediate layer S2 ($Al_2O_3$: 0.6 nm)/pinned layer FP2 (Co: 2 nm/Ru: 1 nm/Co: 5 nm)/antiferromagnetic layer AF2 (PtIrMn: 20 nm)/electrode EL2 (Cu)

Sample 2: Electrode EL1 (Cu)/antiferromagnetic layer AF1 (PtIrMn: 20 nm)/pinned layer FP1 ($CO_2MnSi$: 10 nm)/intermediate layer S1 (MgO: 0.7 nm)/free layer FF (Co: 1 nm/FeNi: 2 nm)/intermediate layer S2 (Cu: 5 nm)/pinned layer FP2 (Co: 4 nm/Ru: 1 nm/Co: 4 nm)/antiferromagnetic layer AF2 (PtMn: 15 nm)/electrode EL2 (Cu)

Sample 3: Electrode EL1 (Cu)/antiferromagnetic layer AF1 (IrMn: 15 nm)/pinned layer FP1 (CrAs: 12 nm)/intermediate layer S1 (Cu: 7 nm)/free layer FF (FeNi: 2 nm)/intermediate layer S2 (MgO: 0.5 nm)/pinned layer FP2 ($CO_2CrAl$: 10 nm)/antiferromagnetic layer AF2 (PtMn: 20 nm)/electrode EL2 (Cu)

Sample 4: Electrode EL1 (Cu)/antiferromagnetic layer AF1 (PtMn: 20 nm)/pinned layer FP1 (Co: 10 nm)/intermediate layer S1 (Cu: 6 nm)/free layer FF (Co: 2 nm/CoFeNi: 1 nm)/intermediate layer S2 ($Al_2O_3$: 0.6 nm)/pinned layer FP2 (Co: 2 nm/Ru: 1 nm/Co: 5 nm)/antiferromagnetic layer AF2 (PtIrMn: 20 nm)/electrode EL2 (Cu)

In the samples thus obtained, the switching current value of the free layer FF was measured. As a result, in the samples 1 to 3, current reduction effect appeared more remarkably than the sample 4. Moreover, in these samples, current was swept to measure a change of resistance accompanying with magnetization switching of the free layer FF. As a result, the mean of the change of resistance was 20% in samples 1 to 3.

[2-6] Advantage

In the magnetic recording element according to the second embodiment of the present invention, at least one of the pinned layer FP1, free layer FF and pinned layer FP2 uses a material having spin polarization different from the other two. If the spin polarization Pp of at least pinned layers FP1 and FP2 is the same, the spin polarization Pp of the pinned layer FP1 (or pinned layer FP2) is set higher than the spin polarization Pf of the free layer FF. On the other hand, the spin polarization Pp is different between the pinned layers FP1 and FP2, smaller spin polarization Ppmin is set less than the spin polarization Pf of the free layer FF.

Moreover, larger spin polarization Ppmax of the pinned layers FP1 and FP2 satisfies the following equation, switching current is advantageously reduced like the first embodiment.

$$Pp\max \geq 0.6Pf + 0.14$$

Figure 32:
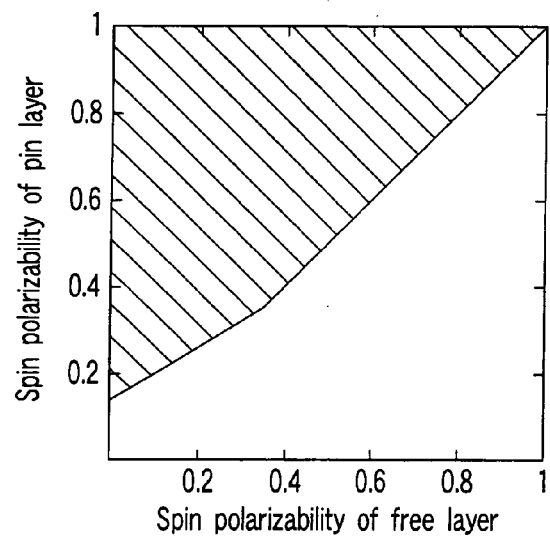
FIG. 32 shows the relationship in spin polarization between pin and free layers of the magnetic recording element according to the second embodiment.

FIG. 32 shows a range of spin polarization Pf, Pp capable of satisfying the condition.

When the polarization Pp1 is equal to the polarization Pp2, the following equation is satisfied.

$$Pp1 = Pp2 \geq 0.6Pf + 0.14$$

(3) THIRD EMBODIMENT

The third embodiment relates to a magnetic recording device using the magnetic recording elements of the first and second embodiments.

[3-1] Basic Structure

The magnetic recording elements of the first and second embodiments have a micro and the magnetization switching mechanism; therefore, these magnetic recording elements are applicable to various devices. More specifically, a large number of magnetic recording elements are arrayed, and thereby, these elements are applied to a recording/reproducing device such as MRAM. An embodiment relevant to this will be described below.

Figure 33:
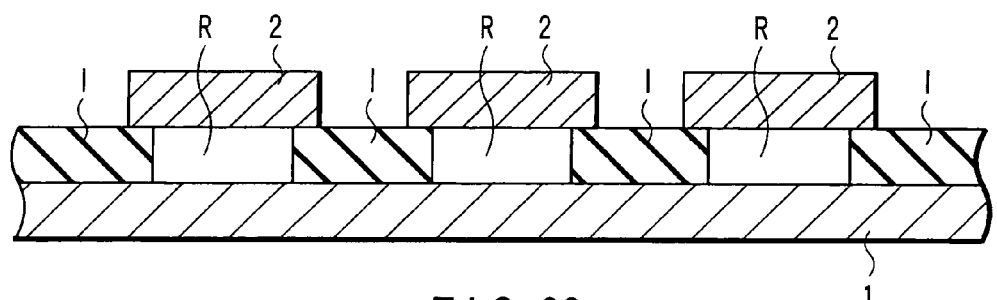
FIG. 33 schematically shows the cross-sectional structure of a magnetic recording device according to a third embodiment of the present invention.

FIG. 33 is schematically shows the cross-sectional structure of a magnetic recording device according to a third embodiment of the present invention. The magnetic recording device of the third embodiment has the following structure. According to the structure, several magnetic recording elements R are arrayed in parallel on an electrode layer (bottom interconnect) 1 called a bit or word line in general. The magnetic recording elements R are realized using any one of magnetic recording elements various structures of the first and second embodiments. These magnetic recording elements R are electrically isolated from each other via an insulating film I. Each magnetic recording element R is connected with an electrode layer (top interconnect) 2 called a bit or word line in general in the upper portion. The bit line and the word line are designated, thereby selecting a specified magnetic recording element R.

Recording to the magnetic recording element R is made by a current flowing from the electrode layer 2 to the element R or current flowing from the element R to the electrode layer 2. Here, a the switching current value determined by the size, structure and composition of the magnetic recording element R is referred as Is. A write current Iw larger than the switching current Is is carried to the magnetic recording element R to write. The recording magnetization direction is identical to the magnetization direction of the pinned layer through which an electronic current passes in the first. Thus the electronic current, that is, current polarity is switched, and thereby, data "0" or "1" is written.

A current is carried between the electrode layers 1 and 2 connected with a reproducing target recording element, and thereby, reproducing (reading) is made. In this case, the current may be carried in both of the flowing directions. In reproducing, a reproducing current Ir smaller than the switching current Is is carried so that recorded data is not rewritten. Voltage or resistance is detected to determine the recorded data. Voltage may be applied across the reproducing target recording element to detect a change of current flowing through the recording element to determine a recording state.

[3-2] Other Structure

EXAMPLE 3-1

A magnetic recording device was manufactured using the magnetic recording element having the same structure as the sample of the Example 2-2 as one example of the third embodiment.

FIG. 34 shows example where one memory cell has a magnetic recording element R and select transistor T. The magnetic recording element R is connected between a bit line BL and one terminal of the select transistor T. Typically, the other terminal of the select transistor T is grounded, and the gate is connected with a word line. A memory cell is manufactured via the following process. Firstly, the select transistor T and the bottom interconnect 1 electrically connected with the select transistor T are formed on a semiconductor substrate via lithography, anisotropic etching such as reactive ion etching (RIE) and ion implantation. The magnetic recording element R is formed on the bottom interconnect according to the same method as described in the Example 1-1. The top interconnect 2 is further formed on the magnetic recording element R.

The memory cell is arrayed in a matrix in a memory cell array MCA. The gate of each select transistor of the memory cells belonging to the same row is connected with the same word line WL. Likewise, each recording element of the memory cells belonging to the same column is connected with the same bit line BL. A decoder and a read circuit are arranged around the memory cell array MCA. The bit line BL and the word line WL are connected with a peripheral circuit SC such as a decoder and read circuit.

The decoder supplies write current Iw and reproducing current Ir to bit line bL and word line WL via the magnetic recording element R having an address corresponding to an address signal from the outside. More specifically, in reproducing or recording, the word line of the select transistor T connected with the target magnetic recording element R is selected, and thereby, the select transistor T is turned on. Then, the write current Iw or reproducing current Ir is carried to the bit line connected with the target magnetic recording element R, and thereby, recording or reproducing is achieved. In this case, the write current Iw larger than the switching current Is determined by the structure of the magnetic recording element R is carried to the cell to record. In the magnetic recording element R manufactured herein, the mean of the switching current Is was 0.18 mA. Therefore, a current having positive and negative polarity beyond the foregoing mean value is used as the write current Iw to achieve a write. On the other hand, read current must not exceed 0.18 mA.

In the example, the select transistor T is used to select the magnetic recording element R, however other switching elements may be used. It is preferable to use elements having low on-resistance. For example, a diode D may be used as seen from FIG. 35. In this case, the series-connected magnetic recording element R and diode D are connected between the word line WL and the bit line BL in each memory cell.

Embodiments of the present invention have been explained with reference to examples. However, the present invention is not limited to the given examples. For example, persons skilled in the art may properly select dimension and material of each component forming the magnetic recoding element, and the structure or material of the electrode, passivation, and insulator from a known range. Even if the present invention is achieved in the same manner, various changes and modifications are included in the scope of the present invention so long as the same effect is obtained.

In the magnetic recording element, components such as ferromagnetic layer, intermediate layer and insulating layer may be formed as a single layer or as a stacked structure of two layers or more.

Besides, persons skilled in the art may properly make a design change based on the magnetic recording element and device described and illustrated in the embodiments of the present invention. A magnetic recording element and device manufactured in the same manner as the present invention all are included in the scope of the present invention so long as they include the subject matter of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic recording element in which a spin polarized electron is injected comprising:
    a free layer whose magnetization direction is changed by an action of a spin-polarized electron and having a spin polarization Pf;
    a pinned layer whose magnetization direction is fixed and having a spin polarization Pp larger than the spin polarization Pf, wherein Pp≧0.6 Pf+0.14 and Pp≧5.0 Pf−2.4 are satisfied; and
    an intermediate layer interposed between the pinned layer and the free layer and consisting essentially of a nonmagnetic material.

2. The element according to claim 1, wherein the intermediate layer consists essentially of a nonmagnetic metal.

3. The element according to claim 1, wherein the intermediate layer includes an insulator material or semiconductor material.

4. The element according to claim 1, wherein the pinned layer consists of a material containing an iron-group transition metal.

5. The element according to claim 1, wherein the pinned layer consists essentially of a half metal.

6. A magnetic recording device comprising:
    a memory cell array having magnetic recording elements including the magnetic recording element described in claim 1 arrayed in a matrix.

7. The device according to claim 6, further comprising:
    a first interconnect electrically connected with one terminal of the magnetic recording elements belonging to a same row;
    a second interconnect electrically connected with another terminal of the magnetic recording elements belonging to a same column; and
    a control circuit connected with the first interconnect and the second interconnect, and carrying a current to the first interconnect and the second interconnect to write and read data to and from one of the magnetic recording elements.

8. The device according to claim 1, wherein the magnetization direction of the free layer is changed by spin-polarized electrons which flow between the free layer and pinned layer via the intermediate layer.

9. A magnetic recording element in which a spin polarized electron is injected comprising:
    a free layer consisting of one or more film, and whose magnetization direction is changed by an action of a spin-polarized electron, and having a spin polarization Pf and a first surface and a second surface facing each other;
    a first intermediate layer provided on the first surface and consisting essentially of a nonmagnetic material;
    a first pinned layer provided on a surface of the first intermediate layer at an opposite side to the first surface and having a spin polarization Pp1, a magnetization direction of the first pinned layer being fixed and parallel to a magnetization direction of a film of the free layer contacting with the first intermediate layer;
    a second intermediate layer provided on the second surface and consisting essentially of a nonmagnetic material; and
    a second pinned layer provided on a surface of the second intermediate layer at an opposite side to the second surface and having a spin polarization Pp2, a magnetization direction of the second pinned layer being fixed and antiparallel to a magnetization direction of a film of the free layer contacting with the second intermediate layer, Pp1=Pp2>Pf or when Pp1≠Pp2, Pf≦Ppmin, which is smaller spin polarization of Pp1 and Pp2, being satisfied.

10. The device according to claim 9, wherein 0.6 Pf+0.14≦Ppmax, which is larger spin polarization of Pp1 and Pp2, is further satisfied when Pp1≠Pp2 and 0.6 Pf+0.14>Pp1=Pp2 is further satisfied when Pp1=Pp2.

11. The element according to claim 9, wherein the first intermediate layer and the second intermediate layer consist essentially of a nonmagnetic metal.

12. The element according to claim 9, wherein the first intermediate layer or the second intermediate layer includes an insulator or semiconductor.

13. The element according to claim 9, wherein the first pinned layer or the second pinned layer consists of a material containing an iron-group transition metal.

14. The element according to claim 9, wherein the first pinned layer or the second pinned layer consists essentially of a half metal.

15. A magnetic recording device comprising:
    a memory cell array having magnetic recording elements including the magnetic recording element described in claim 9 arrayed in a matrix.

16. The device according to claim 15, further comprising:
    a first interconnect electrically connected with one terminal of the magnetic recording elements belonging to a same row;
    a second interconnect electrically connected with another terminal of the magnetic recording elements belonging to a same column; and
    a control circuit connected with the first interconnect and the second interconnect, and carrying a current to the first interconnect and the second interconnect to write and read data of one of the magnetic recording elements.

* * * * *